(12) United States Patent
Ahn et al.

(10) Patent No.: US 7,262,505 B2
(45) Date of Patent: Aug. 28, 2007

(54) SELECTIVE ELECTROLESS-PLATED COPPER METALLIZATION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/929,251

(22) Filed: Aug. 30, 2004

(65) Prior Publication Data

US 2005/0023699 A1    Feb. 3, 2005

Related U.S. Application Data

(62) Division of application No. 09/483,881, filed on Jan. 18, 2000.

(51) Int. Cl.
  *H01L 23/52*  (2006.01)
  *H01L 23/48*  (2006.01)
  *H01L 29/40*  (2006.01)

(52) U.S. Cl. .................. 257/762; 257/758; 257/774; 257/775; 257/E21.584; 438/637; 438/668

(58) Field of Classification Search ............... 257/762, 257/758, 774, 775, 751, E21.584, E21.582, 257/776; 438/637–640, 668
See application file for complete search history.

(56) References Cited

U.S. PATENT DOCUMENTS

| | | | |
|---|---|---|---|
| 1,254,987 A | 1/1918 | Cooper | 420/528 |
| 1,976,375 A | 10/1934 | Smith | 148/11.5 |
| 2,244,608 A | 6/1941 | Cooper | 75/138 |
| 2,842,438 A | 7/1958 | Saarivirta et al. | 75/153 |
| 3,147,110 A | 9/1964 | Foerster | 75/122.5 |

(Continued)

FOREIGN PATENT DOCUMENTS

EP    0304046    2/1989

(Continued)

OTHER PUBLICATIONS

Abe, K., et al., "Sub-half Micron Copper Interconnects Using Reflow of Sputtered Copper Films", *VLSI Multilevel Interconnection Conference*, (Jun. 25-27, 1995), 308-311.

(Continued)

*Primary Examiner*—Kenneth Parker
*Assistant Examiner*—Chris C. Chu
(74) *Attorney, Agent, or Firm*—Schwegman, Lundberg, Woessner & Kluth, P.A.

(57) ABSTRACT

Structures and methods are provided which include a selective electroless copper metallization. The present invention includes a novel methodology for forming copper vias on a substrate, including depositing a thin film seed layer of Palladium (Pd) or Copper (Cu) on a substrate to a thickness of less than 15 nanometers (nm). A number of via holes is defined above the seed layer. A layer of copper is deposited over the seed layer using electroless plating to fill the via holes to a top surface of the patterned photoresist layer. The method can be repeated any number of times, forming second, third and fourth layers of copper. The photoresist layers along with the seed layers in other regions can then be removed, such as by oxygen plasma etching, such that a chemical mechanical planarization process is avoided.

34 Claims, 7 Drawing Sheets

U.S. PATENT DOCUMENTS

| | | | |
|---|---|---|---|
| 3,337,334 A | 8/1967 | Fenn et al. | 75/150 |
| 3,506,438 A | 4/1970 | Krock et al. | 75/208 |
| 3,548,915 A | 12/1970 | Richmond et al. | 164/68 |
| 3,548,948 A | 12/1970 | Richmond et al. | 164/68 |
| 3,687,737 A | 8/1972 | Krock et al. | 148/2 |
| 3,832,456 A | 8/1974 | Kobetz et al. | 423/645 |
| 3,923,500 A | 12/1975 | Kitazawa et al. | 75/156.5 |
| 3,932,226 A | 1/1976 | Klatskin et al. | 204/16 |
| 3,954,570 A | 5/1976 | Shirk et al. | 204/15 |
| 4,022,931 A | 5/1977 | Black et al. | 427/91 |
| 4,029,377 A | 6/1977 | Guglielmi | 339/19 |
| 4,065,330 A | 12/1977 | Masumoto et al. | 148/31.55 |
| 4,101,855 A | 7/1978 | Drapeau | 335/106 |
| 4,158,719 A | 6/1979 | Frantz | 428/567 |
| 4,213,818 A | 7/1980 | Lemons et al. | 438/719 |
| 4,233,066 A | 11/1980 | Sundin et al. | 75/142 |
| 4,314,594 A | 2/1982 | Pfeifer et al. | 148/108 |
| 4,386,116 A | 5/1983 | Nair et al. | 427/99 |
| 4,389,429 A | 6/1983 | Soclof | 438/492 |
| 4,394,223 A | 7/1983 | Hall | 204/15 |
| 4,423,547 A | 1/1984 | Farrar et al. | 29/571 |
| 4,561,173 A | 12/1985 | Te Velde | 438/619 |
| 4,574,095 A | 3/1986 | Baum et al. | 427/53.1 |
| 4,670,297 A | 6/1987 | Lee et al. | 427/91 |
| 4,709,359 A | 11/1987 | Loftin | 367/155 |
| 4,762,728 A | 8/1988 | Keyser et al. | 427/38 |
| 4,788,082 A | 11/1988 | Schmitt | 427/248.1 |
| 4,824,544 A | 4/1989 | Mikalesen et al. | |
| 4,847,111 A | 7/1989 | Chow et al. | 427/38 |
| 4,857,481 A | 8/1989 | Tam et al. | 437/182 |
| 4,931,410 A | 6/1990 | Tokunaga et al. | 437/189 |
| 4,933,743 A * | 6/1990 | Thomas et al. | 257/742 |
| 4,948,459 A | 8/1990 | Van Laarhoven et al. | 156/643 |
| 4,962,058 A | 10/1990 | Cronin et al. | 437/187 |
| 4,996,584 A | 2/1991 | Young et al. | 357/71 |
| 5,019,531 A | 5/1991 | Awaya et al. | 437/180 |
| 5,034,799 A | 7/1991 | Tomita et al. | 357/71 |
| 5,045,635 A | 9/1991 | Kaplo et al. | 174/35 GC |
| 5,071,518 A | 12/1991 | Pan | |
| 5,084,412 A | 1/1992 | Nakasaki | 437/189 |
| 5,100,499 A | 3/1992 | Douglas | 156/635 |
| 5,130,274 A | 7/1992 | Harper et al. | 437/195 |
| 5,148,260 A | 9/1992 | Inoue et al. | 357/67 |
| 5,149,615 A | 9/1992 | Chakravorty et al. | 430/313 |
| 5,158,986 A | 10/1992 | Cha et al. | 521/82 |
| 5,173,442 A | 12/1992 | Carey | 437/173 |
| 5,227,658 A | 7/1993 | Beyer et al. | 257/522 |
| 5,231,036 A | 7/1993 | Miyauchi et al. | 65/23 |
| 5,231,056 A | 7/1993 | Sandhu | 437/200 |
| 5,232,866 A | 8/1993 | Beyer et al. | 437/62 |
| 5,243,222 A | 9/1993 | Harper et al. | 257/774 |
| 5,256,205 A | 10/1993 | Schmitt, III et al. | 118/723 |
| 5,268,315 A | 12/1993 | Prasad et al. | 437/31 |
| 5,308,440 A | 5/1994 | Chino et al. | 156/664 |
| 5,324,683 A | 6/1994 | Fitch et al. | 437/65 |
| 5,324,684 A | 6/1994 | Kermani et al. | 437/95 |
| 5,334,356 A | 8/1994 | Baldwin et al. | 422/133 |
| 5,336,914 A | 8/1994 | Andoh | 257/368 |
| 5,348,811 A * | 9/1994 | Nagao et al. | 428/699 |
| 5,354,712 A | 10/1994 | Ho et al. | 437/195 |
| 5,356,672 A | 10/1994 | Schmitt, III et al. | 427/446 |
| 5,371,042 A | 12/1994 | Ong | 437/194 |
| 5,374,849 A | 12/1994 | Tada | |
| 5,384,284 A | 1/1995 | Doan et al. | 437/190 |
| 5,399,897 A | 3/1995 | Cunningham et al. | 257/467 |
| 5,401,680 A | 3/1995 | Abt et al. | |
| 5,408,742 A | 4/1995 | Zaidel et al. | 29/846 |
| 5,413,687 A | 5/1995 | Barton et al. | 204/192.14 |
| 5,413,962 A | 5/1995 | Lur et al. | 437/195 |
| 5,424,030 A | 6/1995 | Takahashi | 420/473 |
| 5,426,330 A | 6/1995 | Joshi et al. | 257/752 |
| 5,442,237 A | 8/1995 | Hughes et al. | 257/759 |
| 5,444,015 A | 8/1995 | Aitken et al. | 437/182 |
| 5,447,887 A | 9/1995 | Filipiak et al. | 437/200 |
| 5,457,344 A | 10/1995 | Bartelink | 257/737 |
| 5,470,789 A | 11/1995 | Misawa | 437/190 |
| 5,470,801 A | 11/1995 | Kapoor et al. | 437/238 |
| 5,476,817 A | 12/1995 | Numata | 437/195 |
| 5,485,037 A | 1/1996 | Marrs | 257/712 |
| 5,495,667 A | 3/1996 | Farnworth et al. | 29/843 |
| 5,506,449 A | 4/1996 | Nakano et al. | 257/758 |
| 5,510,645 A | 4/1996 | Fitch et al. | 257/522 |
| 5,529,956 A | 6/1996 | Morishita | 437/195 |
| 5,534,731 A | 7/1996 | Cheung | 257/759 |
| 5,538,922 A | 7/1996 | Cooper et al. | 437/195 |
| 5,539,060 A | 7/1996 | Tsunogae et al. | 525/338 |
| 5,539,227 A | 7/1996 | Nakano | 257/276 |
| 5,578,146 A | 11/1996 | Grant et al. | 148/437 |
| 5,595,937 A | 1/1997 | Mikagi | 437/192 |
| 5,609,721 A | 3/1997 | Tsukune et al. | 156/646.1 |
| 5,625,232 A | 4/1997 | Numata et al. | 257/758 |
| 5,633,200 A | 5/1997 | Hu | |
| 5,635,253 A | 6/1997 | Canaperi et al. | 427/437 |
| 5,654,245 A * | 8/1997 | Allen | 438/629 |
| 5,662,788 A | 9/1997 | Sandhu et al. | 205/87 |
| 5,667,600 A | 9/1997 | Grensing et al. | 148/437 |
| 5,670,420 A | 9/1997 | Choi | 437/189 |
| 5,674,787 A * | 10/1997 | Zhao et al. | 438/627 |
| 5,675,187 A | 10/1997 | Numata et al. | 257/758 |
| 5,679,608 A | 10/1997 | Cheung et al. | 437/195 |
| 5,681,441 A | 10/1997 | Svendsen et al. | 205/114 |
| 5,693,563 A | 12/1997 | Teong | |
| 5,695,810 A * | 12/1997 | Dubin et al. | 438/643 |
| 5,705,425 A | 1/1998 | Miura et al. | 437/182 |
| 5,719,089 A | 2/1998 | Cherng et al. | 438/637 |
| 5,719,410 A | 2/1998 | Suehiro et al. | 257/77 |
| 5,719,447 A | 2/1998 | Gardner | |
| 5,725,689 A | 3/1998 | Nishida et al. | 148/320 |
| 5,739,579 A | 4/1998 | Chiang et al. | 257/635 |
| 5,763,953 A | 6/1998 | IIjima et al. | 257/762 |
| 5,780,358 A | 7/1998 | Zhou et al. | 438/645 |
| 5,785,570 A | 7/1998 | Bruni | 445/52 |
| 5,789,264 A | 8/1998 | Chung | |
| 5,792,522 A | 8/1998 | Jin et al. | 427/575 |
| 5,792,706 A | 8/1998 | Michael et al. | 438/626 |
| 5,801,098 A | 9/1998 | Fiordalice et al. | 438/653 |
| 5,814,557 A | 9/1998 | Venkatraman et al. | 438/622 |
| 5,821,168 A | 10/1998 | Jain | 438/692 |
| 5,824,599 A | 10/1998 | Schacham-Diamand et al. | 438/678 |
| 5,840,625 A | 11/1998 | Feldner | |
| 5,852,871 A | 12/1998 | Khandros | 29/843 |
| 5,858,877 A | 1/1999 | Dennison et al. | 438/700 |
| 5,880,018 A | 3/1999 | Boeck et al. | 438/619 |
| 5,891,797 A | 4/1999 | Farrar | 438/619 |
| 5,891,804 A | 4/1999 | Havemann et al. | 438/674 |
| 5,893,752 A | 4/1999 | Zhang et al. | 438/687 |
| 5,895,740 A | 4/1999 | Chien et al. | 430/313 |
| 5,897,370 A | 4/1999 | Joshi et al. | 438/632 |
| 5,899,740 A | 5/1999 | Kwon | |
| 5,900,668 A | 5/1999 | Wollesen | 257/522 |
| 5,907,772 A | 5/1999 | Iwasaki | 438/253 |
| 5,911,113 A | 6/1999 | Yao et al. | 438/649 |
| 5,913,147 A | 6/1999 | Dubin et al. | 438/687 |
| 5,925,930 A | 7/1999 | Farnworth et al. | 257/737 |
| 5,930,596 A | 7/1999 | Klose et al. | 438/98 |
| 5,930,669 A | 7/1999 | Uzoh | 438/627 |
| 5,932,928 A | 8/1999 | Clampitt | 257/758 |
| 5,933,758 A | 8/1999 | Jain | 438/687 |
| 5,937,320 A | 8/1999 | Andricacos et al. | |
| 5,940,733 A | 8/1999 | Beinglass et al. | 438/655 |
| 5,948,467 A | 9/1999 | Nguyen et al. | 427/99 |
| 5,962,923 A | 10/1999 | Xu et al. | 257/774 |
| 5,968,327 A | 10/1999 | Kobayashi et al. | |

| | | | |
|---|---|---|---|
| 5,968,333 A | 10/1999 | Nogami et al. ............... 205/184 |
| 5,969,398 A | 10/1999 | Murakami |
| 5,969,422 A | 10/1999 | Ting et al. ................... 257/762 |
| 5,972,179 A | 10/1999 | Chittipeddi et al. ... 204/192.17 |
| 5,972,804 A | 10/1999 | Tobin et al. ................. 438/786 |
| 5,976,710 A | 11/1999 | Sachdev et al. ............ 428/620 |
| 5,981,350 A | 11/1999 | Geusic et al. ............... 438/386 |
| 5,985,759 A | 11/1999 | Kim et al. ................... 438/653 |
| 5,989,623 A | 11/1999 | Chen et al. ................... 427/97 |
| 5,994,776 A | 11/1999 | Fang et al. .................. 257/758 |
| 5,994,777 A | 11/1999 | Farrar ......................... 257/758 |
| 6,001,730 A | 12/1999 | Farkas et al. ............... 438/627 |
| 6,001,736 A | 12/1999 | Kondo et al. |
| 6,004,884 A | 12/1999 | Abraham .................... 438/714 |
| 6,008,117 A | 12/1999 | Hong et al. ................. 438/629 |
| 6,015,465 A | 1/2000 | Kholodenko et al. ....... 118/719 |
| 6,015,738 A | 1/2000 | Levy et al. .................. 438/275 |
| 6,022,802 A | 2/2000 | Jang ............................ 438/656 |
| 6,025,261 A | 2/2000 | Farrar et al. ................ 438/619 |
| 6,028,362 A | 2/2000 | Omura |
| 6,030,877 A | 2/2000 | Lee et al. .................... 438/381 |
| 6,030,895 A | 2/2000 | Joshi et al. |
| 6,037,248 A | 3/2000 | Ahn ............................ 438/619 |
| 6,054,172 A | 4/2000 | Robinson et al. ............. 427/97 |
| 6,057,226 A | 5/2000 | Wong .......................... 438/623 |
| 6,069,068 A | 5/2000 | Rathore et al. ............. 438/628 |
| 6,071,810 A | 6/2000 | Wada et al. ................. 438/635 |
| 6,075,278 A | 6/2000 | Farrar ......................... 257/522 |
| 6,075,287 A | 6/2000 | Ingraham et al. ........... 257/706 |
| 6,091,136 A | 7/2000 | Jiang et al. .................. 257/676 |
| 6,091,475 A | 7/2000 | Ogino et al. ................ 349/149 |
| 6,100,193 A | 8/2000 | Suehiro et al. ............. 438/685 |
| 6,103,320 A | 8/2000 | Matsumoto et al. |
| 6,120,641 A | 9/2000 | Stevens et al. ......... 156/345.22 |
| 6,121,126 A | 9/2000 | Ahn et al. ................... 438/602 |
| 6,126,989 A | 10/2000 | Robinson et al. ............. 427/97 |
| 6,136,095 A | 10/2000 | Xu et al. ..................... 118/719 |
| 6,139,699 A | 10/2000 | Chiang et al. .......... 204/192.15 |
| 6,140,228 A | 10/2000 | Shan et al. .................. 438/653 |
| 6,140,234 A | 10/2000 | Uzoh et al. ................. 438/678 |
| 6,140,456 A | 10/2000 | Lee et al. .................... 528/196 |
| 6,143,641 A | 11/2000 | Kitch .......................... 438/618 |
| 6,143,646 A | 11/2000 | Wetzel ........................ 438/637 |
| 6,143,655 A | 11/2000 | Forbes et al. |
| 6,143,671 A | 11/2000 | Sugai |
| 6,150,214 A | 11/2000 | Kaeriyama |
| 6,150,261 A | 11/2000 | Hsu et al. ................... 438/640 |
| 6,153,507 A | 11/2000 | Mikagi ........................ 438/618 |
| 6,159,769 A | 12/2000 | Farnworth et al. .......... 438/108 |
| 6,159,842 A | 12/2000 | Chang et al. ................ 438/622 |
| 6,168,704 B1 | 1/2001 | Brown et al. ............... 205/118 |
| 6,169,024 B1 | 1/2001 | Hussein |
| 6,171,661 B1 | 1/2001 | Zheng et al. ................ 427/535 |
| 6,174,804 B1 | 1/2001 | Hsu |
| 6,177,350 B1 | 1/2001 | Sundarrajan et al. ....... 438/688 |
| 6,183,564 B1 | 2/2001 | Reynolds et al. ........... 118/719 |
| 6,187,656 B1 | 2/2001 | Lu et al. ..................... 438/592 |
| 6,190,732 B1 | 2/2001 | Omstead et al. ............ 118/729 |
| 6,197,181 B1 | 3/2001 | Chen .......................... 205/123 |
| 6,197,688 B1 * | 3/2001 | Simpson ..................... 438/678 |
| 6,204,065 B1 | 3/2001 | Ochiai ........................ 436/66 |
| 6,207,222 B1 | 3/2001 | Chen et al. ................... 427/97 |
| 6,207,553 B1 | 3/2001 | Buynoski et al. ........... 438/622 |
| 6,207,558 B1 | 3/2001 | Singhvi et al. .............. 438/648 |
| 6,208,016 B1 | 3/2001 | Farrar ......................... 257/643 |
| 6,211,049 B1 | 4/2001 | Farrar ......................... 438/597 |
| 6,211,073 B1 | 4/2001 | Ahn et al. ................... 438/653 |
| 6,211,561 B1 | 4/2001 | Zhao ........................... 257/522 |
| 6,214,719 B1 | 4/2001 | Nag ............................ 438/619 |
| 6,215,186 B1 | 4/2001 | Konecni et al. |
| 6,218,282 B1 | 4/2001 | Buynoski .................... 438/619 |
| 6,221,763 B1 | 4/2001 | Gilton et al. ................ 438/643 |
| 6,232,219 B1 | 5/2001 | Blalock et al. .............. 438/637 |
| 6,245,658 B1 | 6/2001 | Buynoski .................... 438/619 |
| 6,245,662 B1 | 6/2001 | Naik et al. |
| 6,246,118 B1 | 6/2001 | Buynoski .................... 257/758 |
| 6,249,056 B1 | 6/2001 | Kwon et al. ................ 257/758 |
| 6,251,781 B1 * | 6/2001 | Zhou et al. .................. 438/687 |
| 6,258,707 B1 | 7/2001 | Uzoh |
| 6,265,311 B1 | 7/2001 | Hautala et al. .............. 438/680 |
| 6,265,811 B1 | 7/2001 | Takeuchi et al. ............ 310/330 |
| 6,268,276 B1 | 7/2001 | Chan et al. .................. 438/619 |
| 6,268,277 B1 | 7/2001 | Bang .......................... 438/619 |
| 6,271,592 B1 | 8/2001 | Kim et al. ................... 257/751 |
| 6,277,263 B1 | 8/2001 | Chen .......................... 205/182 |
| 6,281,585 B1 | 8/2001 | Bothra ........................ 257/758 |
| 6,284,656 B1 | 9/2001 | Farrar ......................... 438/687 |
| 6,287,954 B1 | 9/2001 | Ashley et al. ............... 438/622 |
| 6,288,442 B1 | 9/2001 | Farrar ......................... 257/678 |
| 6,288,447 B1 | 9/2001 | Amishiro et al. |
| 6,288,905 B1 | 9/2001 | Chung ........................ 361/771 |
| 6,290,833 B1 | 9/2001 | Chen .......................... 205/182 |
| 6,303,498 B1 * | 10/2001 | Chen et al. .................. 438/675 |
| 6,323,543 B1 | 11/2001 | Jiang et al. .................. 257/676 |
| 6,323,553 B1 | 11/2001 | Hsu et al. ................... 257/751 |
| 6,326,303 B1 | 12/2001 | Robinson et al. ........... 438/678 |
| 6,329,279 B1 | 12/2001 | Lee ............................ 438/619 |
| 6,333,255 B1 | 12/2001 | Sekiguchi |
| 6,342,448 B1 | 1/2002 | Lin et al. ..................... 438/687 |
| 6,350,678 B1 | 2/2002 | Pramanick et al. |
| 6,358,842 B1 | 3/2002 | Zhou et al. .................. 438/633 |
| 6,359,328 B1 | 3/2002 | Dubin ......................... 257/622 |
| 6,361,667 B1 | 3/2002 | Kobayashi et al. |
| 6,365,511 B1 * | 4/2002 | Kizilyalli et al. ........... 438/649 |
| 6,368,954 B1 | 4/2002 | Lopatin et al. .............. 438/627 |
| 6,368,966 B1 | 4/2002 | Krishnamoorthy et al. . 438/687 |
| 6,372,622 B1 | 4/2002 | Tan et al. .................... 438/612 |
| 6,376,368 B1 | 4/2002 | Jung et al. |
| 6,376,370 B1 | 4/2002 | Farrar ......................... 438/678 |
| 6,383,920 B1 | 5/2002 | Wang et al. ................. 438/639 |
| 6,387,542 B1 | 5/2002 | Kozlov et al. .............. 428/673 |
| 6,399,489 B1 | 6/2002 | M'Saad et al. ............. 438/680 |
| 6,403,481 B1 | 6/2002 | Matsuda et al. ............ 438/687 |
| 6,417,094 B1 | 7/2002 | Zhao et al. |
| 6,428,673 B1 | 8/2002 | Ritzdorf et al. .............. 205/84 |
| 6,429,120 B1 | 8/2002 | Ahn et al. ................... 438/635 |
| 6,486,533 B2 | 11/2002 | Krishnamoorthy et al. . 257/586 |
| 6,492,266 B1 | 12/2002 | Ngo et al. |
| 6,508,920 B1 | 1/2003 | Ritzdorf et al. ............. 204/194 |
| 6,518,198 B1 | 2/2003 | Klein .......................... 438/758 |
| 6,563,219 B2 | 5/2003 | Ireland et al. ............... 257/758 |
| 6,565,729 B2 | 5/2003 | Chen et al. ................... 205/82 |
| 6,589,863 B1 | 7/2003 | Usami |
| 6,632,345 B1 | 10/2003 | Chen .......................... 205/182 |
| 6,638,410 B2 | 10/2003 | Chen et al. .................. 205/182 |
| 6,664,197 B2 | 12/2003 | Stevens et al. .............. 438/754 |
| 2001/0002333 A1 | 5/2001 | Huang et al. ............... 438/637 |
| 2001/0054771 A1 | 12/2001 | Wark et al. ................. 257/786 |
| 2002/0014646 A1 | 2/2002 | Tsu et al. .................... 257/296 |
| 2002/0028552 A1 | 3/2002 | Lee et al. .................... 438/243 |
| 2002/0096768 A1 | 7/2002 | Joshi .......................... 257/750 |
| 2002/0109233 A1 | 8/2002 | Farrar ......................... 257/762 |
| 2002/0167089 A1 | 11/2002 | Ahn et al. ................... 257/762 |
| 2003/0034560 A1 | 2/2003 | Matsuse et al. |
| 2004/0206308 A1 | 10/2004 | Ahn et al. |
| 2005/0023697 A1 | 2/2005 | Ahn et al. |
| 2006/0246733 A1 | 11/2006 | Ahn et al. |
| 2006/0255462 A1 | 11/2006 | Farrar |

FOREIGN PATENT DOCUMENTS

| JP | 05267643 | 10/1993 |
|---|---|---|
| JP | 07078815 | 3/1995 |

JP  07321111  8/1995

OTHER PUBLICATIONS

American Society For Metals, "Metals Handbook",*Properties and Selection: Nonferrous Alloys and Pure Metals, Ninth Edition, vol. 2*, Metals Park, Ohio : American Society for Metals, (1989), 157,395.
American Society For Metals, "Metals Handbook",*Metals Park, Ohio : American Society for Metals, 8th Edition, vol. 8*, (1973), 300-302.
ANONYMOUS, "Formation of Conductors at Variable Depths—Using Differential Photomask, Projecting Images into Insulator by Reactive Ion Etching, Selectively Filling Images with Conductor",*Research Disclosure*, Disclosure No. RD 291015, Abstract, (Jul. 10, 1988), 1 page.
Bernier, M., et al., "Laser processing of palladium for selective electroless copper plating", *SPIE, 2045*, (1994),330-337.
Chang, J.Y.C., et al., "Large Suspended Inductors on Silicon and their use in a 2-um CMOS RF Amplifier", *IEEE Electron Device Letters, 14(5)*, (May 1993),246-248.
Craig, J.D., "Polymide Coatings",*Packaging, Electronic Materials Handbook, vol. 1*, ASM International Handbook Committee (eds.), ASM International, Materials Park, OH, (1989), 767-772.
Dubin, V.M., et al., "Selective and Blanket Electroless Copper Deposition for Ultralarge Scale Integration", *Journal of the Electrochemical Society, 144(3)*, (1997),898-908.
Dudzinski, N., et al., "The Youngs Modulus of Some Aluminim Alloys",*J. Institute of Metals, vol. LXXIV*, (1947-48),291-314.
Izaki, M., et al., "Characterization of Transparent Zinc Oxide Films Prepared by Electrochemical Reaction",*Journal of the Electrochemical Society, 144*, (Jun. 1997), 1949-1952.
Jayaraj, K., "Low Dielectric Constant Microcellular Foams",*Proceedings from the Seventh Meeting of the DuPont Symposium on Polymides in Microelectrics*, (Sep. 1996),474-501.
Jin, C., et al., "Porous Xerogel Films as Ultra-low Permittivity Dielctrics for ULSI Interconnect Applications",*Conference Proceedings ULSI XII—1997 Materials Research Society*, (1997),463-469.
Kang, H.K., et al., "Grain Structure and Electromigration Properties of CVD CU Metalization",*Proceedings of the 10th International VLSI Multilevel Interconnection Conference*, (Jun. 8-9, 1993),223-229.
Kirk, Raymond E.,*Kirk-Othmer Concise Encyclopedia of Chemical Technology*, Grayson, M., (ed.), John Wiley & Sons, Inc., New York, NY,(1985), 433-435, 926-938.
Ramos, T , et al., "Nanoporous Silica for Dielectric Constant Less Than 2",*Conference Proceedings ULSI XII - 1997 Materials Research Society*, (1997),455-461.
Rossnagel, S. M., "Magnetron Sputter Deposition of Interconnect Applications",*Conference Proceedings, ULSI XI*, (1996),227-232.
Shacham-Diamond, Y., "100 nm Wide Copper Lines Made by Selective Electroless Deposition",*Journal of Micromechanics and Microengineering, 1*, (Mar. 1991),66-72.
Shieh, B., et al., "Air-Gap Formation During IMD Deposition to Lower Interconnect Capacitance",*IEEE Electron Device Letters, 19(1)*, (1998), 16-18.
Singer, Ferdinand L., "Strength of Materials",*Harper & Brothers, New York*, (1951),229-32.
Srivatsa, A. R., et al., "Jet Vapor Deposition: an Alternative to Electrondeposition",*Surface Engineering, 11*, (1995),75-77.
Tao, J. , et al., "Electromigration Characteristics of Copper Interconnects",*IEEE Electron Devices Letters, 14(5)*, (May 1993),249-251.
Ting, C. H., "Methods and Needs for Low K Material Research",*Materials Research Society Symposium Proceedings, vol. 381*, Low-Dielectric Constant Materials—Synthesis and Applications in Microelectronics, Lu, T.M., et al., (eds.), San Francisco, CA,(Apr. 17-19, 1995),3-17.
Ueda, T. , et al., "A novel Air Gap Integration Scheme for Multilevel Interconnects using Self-aligned Via Plugs",*Symposium on VLSI Technology Digest of Technical Papers*, (1998),46-47.
Van Vlack, Lawrence H., "Elements of Materials Science",*Addison-Wesley Publishing Co., Inc. Reading, MA*, (1959),468.

Wang, X. W., et al., "Highly Reliable Silicon Nitride Thin Films Made by Jet Vapor Deposition",*Japanese Journal of Applied Physics, vol. 34, Part1, No. 2B*, (Feb. 1995),955-958.
Wolf, S., et al., *Silicon Processing for the VLSI Era, vol.1—Process Technology*, Lattice Press, Sunset Beach, CA,(1986),514-538.
Wolf, S., "Chapter 4; Multilevel-Interconnect Technology for VLSI and ULSI",*Silicon Processing for the VLSI Era, vol. 2 Process Integration*, Lattice Press, Sunset Beach, CA,(1990),176-297.
Zhang, J. , et al., "Investigations of photo-induced decomposition of palladium acetate for electroless copper plating",*Thin Solid Films, 318*, (1998),pp. 234-238.
Murarka, S. P., et al., "Copper Metallization for ULSI and Beyond",*Critical Reviews in Solid State and Materials Sciences, 20(2)*, (1995),87-124.
Bhansali, S., et al., "Selective seeding of copper films on polyimide-patterned silicon substrate, using ion implantation",*Sensors and Actuators A: Physical, 52(1)*, (Mar. 1996), 126-131.
"Brooks Model 5964 High Performance Metal Seal Mass Flow Controller (Introduced in 1991)", *Brooks Instrument*, http://www.frco.com/brooks/semiconductor/products1i.html,(1991),1 page.
"Improved Metallurgy for Wiring Very Large Scale Integrated Circuits", *International Technology Disclosures, 4*, Abstract,(1986),1 page.
American Society For Metals, "Phase Diagrams", *Metals Handbook, 10th Ed., vol. 3*, Metals Park, Ohio,(1992).
Andricacos, P.C., "Copper On-Chip Interconnections", *The Electrochemical Society Interface*, (1999),32-37.
Bae, Sanghoon, et al., "Low-Temperature Deposition Pathways to Silicon Nitride, Amorphous Silicon, Polycrystalline Silicon, and n type Amorphous Silicon Films Using a High Density Plasma System", *IEEE Conference Records--- Abstracts, International Conference on Plasma Science*,(1997),315.
Bai, G., "Copper Interconnection Deposition Techniques and Intergration", *1996 Symposium on VLSI Technology, Digest of Technical Papers*,(1996),48-49.
Bhansali, S., et al., "A novel technique for fabrication of metallic structures on polymide by selective electroless copper plating using ion implantation", *Thin Solid Films, 270, No. 1/02*,(1995),489-492.
Braud, F., "Ultra Thin Diffusion Barriers for Cu Interconnections at The Gigabit Generation and Beyond", *MIC Conference Proceedings*, (1996),174-179.
Cabrera, A., L., et al., "Oxidation protection for a variety of transition metals and copper via surface silicides formed with silane containing atmospheres", *Journal of Materials Research,6(1)*,(1991),71-79.
Chakravorty, K. K., et al., "High-Density Interconnection Using Photosensitive Polymide and Electroplated Copper Conductor Lines", *IEEE Transactions on Components, Hybrids, and Manufacturing Technology, 13(1)*, (Mar. 1990),200-206.
De Felipe, T. S., et al., "Electrical Stability and Microstructural Evolution in Thin Films of High Conductivity Copper Alloys", *Interconnect Technology, 1999, IEEE International Conference*, (May 24-26, 1999),293-295.
Ding, "Copper Barrier, Seed Layer and Planarization Technologies", *VMIC Conference Proceedings*, (1997),87-92.
Dushman, S., et al., *Scientific Foundations of Vacuum Technique, 2nd Edition*, John Wiley and Sons,(1962),1-806.
Edelstein, D., "Full Copper Wiring in a Sub-0.25 micrometer CMOS ULSI Technology", *Technicla Digest., International Electron Devices Meeting*, (Dec. 7-10, 1997),773-776.
Eisenbraun, E. T., et al., "Selective and Blanket Low-Temperature Copper CVD for Multilevel Metalization in ULSI", *Conference Proceedings ULSI-VII*, (1992),5 pages.
Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),283-285.
Fukuda, T., et al., "0.5 -micrometer-Pitch Copper-Dual-Damascene Metallization Using Organic SOG (k=2.9) for 0.18-micrometer CMOS Applications", *Electron Devices Meeting, 1999, IEDM Technical Digest International*, (1999),619-622.

Gladlfelter, W. L., et al., "Trimethylamine Complexes of Alane as Precursors for the Low-Pressure Chemical Vapor Deposition of Aluminum", *Chemistry of Materials, 1,* (1989),pp. 339-343.

Godbey, D. J., et al., "Copper Diffusion in Organic Polymer Resists and Inter-level Dielectrics", *Thin Solid Films, 308-309,* (1997),pp. 470-474.

Grimblot, J., et al., "II. Oxidation of Aluminum Films", *Journal of the Electrochemical Society, 129(10),* (1982),2369-2372.

Hattangady, S.V., et al., "Integrated processing of silicon oxynitride films by combined plasma and rapid-thermal processing", *J. Vac. Sci. Technol. A, 14(6),* (1996),pp. 3017-3023.

Holloway, Karen, et al., "Tantalum as a diffusion barrier between copper and a silicon", *Applied Physics Letters, 57(17),* (Oct. 1990),1736-1738.

Hu, C.K., et al., "Extendibility of Cu Damascene to 0.1 micrometer Wide Interconnections", *Mat. Res. Soc. Symp. Proc. 514,* (1998),pp. 287-291.

Hymes, S., et al., "Passivation of Copper by Silicide Formation in Dilute Silane", *Conference Processings ULSI-VII,* (1992),425-431.

Iijima, T., "Microstructure and Electrical Properties of Amorphous W-Si-N Barrier Layer for Cu Interconnections", *1996 VMIC Conference,* (1996),168-173.

Jeon, Y., et al., "Low-Temperature Fabrication of Polycrystalline Silicon Thin Films by ECR Pecvd", *The Electrochemical Society Proceedings, 94(35),* (1995),103-114.

Kaloyeros, A. E., et al., "Blanket and Selective Copper CVD from Cu(FOD)2 for Multilivel Metallization", *Mat. Res. Soc. Symp. Proc.,* vol. 181,(1990),6 pages.

Kamins, T. I., "Structure and Properties of LPCVD Silicon Films", *J. Electrochem. Soc.: Solid-State Science and Technology, 127,* (Mar. 1980),pp. 686-690.

Keppner, H., et al., "The Micromorph" Cell: A New Way to High-Efficiency-Low-Temperature Crystalline Silicon Thin-Film Cell Manufacturing, *Mat. Res. Soc. Symp. Proc., 452,* (1997),pp. 865-876.

Kiang, M., et al., "Pd/Si plasma immersion ion implantation for selective electroless copper plating on SiO2", *Applied Physics Letters, 60(22),* (Jun. 1, 1992),2767-2769.

Kirk, Raymond E., *Kirk-Othmer Concise Encyclopedia of Chemical Technology,* Grayson, M., (ed.), John Wiley & Sons, Inc., New York, NY,(1985),433-435, 926-938.

Kistiakowsky, G. B., et al., "Reactions of Nitrogen Atoms. I. Oxygen and Oxides of Nitrogen", *The Journal of Chemical Physics, 27(5),* (1957),pp. 1141-1149.

Klaus, J W., "Atomic Layer Deposition of Tungsten Nitride Films Using Sequential Surface Reactions", *Journal of the Electrochemical Society,* vol. 147, No. 3,(Mar. 2000), 1175-1181.

Laursen, T., "Encapsulation of Copper by Nitridation of Cu-Ti Alloy/Bilayer Structures", *International Conference on Metallurgical Coatings and Thin Films,* Abstract No. H1.03, San Diego, CA,(Apr. 1997),309.

Lyman, T., et al., "Metallography, Structures and Phase Diagrams", *Metals Handbook, 8,* American Society for Metals, Metals Park, Ohio,(1989),pp. 300 & 302.

Marcadal, C., "OMCVD Copper Process for Dual Damascene Metallization", *VMIC Conference,* ISMIC,(1997),93-97.

Miller, R. D., "Low Dielectric Constant Polyimides and Polymide Nanofoams", *Seventh Meeting of the DuPont Symposium on Polymides in Microelectronics,* (Sep. 1996),443-473.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE, 2335,*(1994),pp. 80-90.

Nakao, S., et al., "Thin and Low-Resistivity Tantalum Nitride Diffusion Barrier and Giant-Grain Copper Interconnects for Advanced ULSI Metallization", *Japanese Journal of Applied Physics, 38(4B),*(Apr. 1999),pp. 262-263.

Okamoto, Y., et al., "Magnetically Excited Plasma Oxynitridation of Si at Room Temperature", *Japanese Journal of Applied Physics, 34,*(1995),L955-957.

Radzimski, Z. J., et al., "Directional Copper Deposition using d-c Magnetron Self-sputtering", *J. Vac. Sci. Technol. B, 16(3),*(1998),pp. 1102-1106.

Rath, J. K., et al., "Low-Temperature deposition of polycrystalline silicon thin films by hot-wire CVD", *Solar Energy Materials and Solar Cells, 48,*(1997),pp. 269-277.

Ray, S. K., et al., "Flourine-enhanced nitridation of silicon at low temperatures in a microwave plasma", *J. Appl. Phys., 70(3),*(1991),pp. 1874-1876.

Rossnagel, S. M., "Magnetron Sputter Deposition of Interconnect Applications", *Conference Proceedings, ULSI XI,*(1996),227-232.

Rossnagel, S. M., et al., "Metal ion deposition from ionized mangetron sputtering discharge", *J. Vac. Sci. Technol. B, 12(1),*(1994),pp. 449-453.

Ryan, J.G., "Copper Interconnects for Advanced Logic and DRAM", Extended Abstracts of the 1998 International Conference on Solid-State Devices and Materials, Hiroshima,(1998),pp. 258-259.

Ryu, C., et al., "Barriers for copper interconnections", *Solid State Technology,* (Apr 1999),pp. 53,54,56.

Saarivirta, M. J., "High Conductivity Copper Rich Cu-Zr Alloys", *Transactions of the Metallurgical Society of AIME, 218,*(1960),431-437.

Senzaki, Y., "Chemical Vapor Deposition of Copper using a New Liquid Precursor with Improved Thermal Stability", *Conference Proceedings ULSI XIII, Materials Research Society,*(1998),pp. 451-455.

Shacham-Diamond, Y., et al., "Copper electroless deposition technology for ultra-large-scale-integration (ULSI) metallization", *Microelectronic Engineering, 33,*(1997),pp. 47-58.

Stroud, P. T., et al., "Preferential deposition of silver induced by low energy gold ion implantation", *Thin Solid Films, Switzerland,* vol. 9, No. 2, XP000993098,(Feb. 1972),273-281.

Tsukada, T., et al., "Adhesion of copper films on ABS polymers deposited in an internal magnet magnetron sputtering system", *J. Vac. Sci. Technol., 16(2),* (Apr. 1999),2368-2372.

Uchida, Y., et al., "A Fluorinated Organic-Silica Film with Extremely Low Dielectric Constant", *Japanese Journal of Applied Physics,* vol. 38 Part 1 No. 4B, (Apr. 1999),2368-2372.

Venkatesan, S., et al., "A High Performance 1.8V, 0.20 micrometer CMOS Technology with Copper Metalization", *Electron Devices Meeting, 1997. Technical Digest., International,*(Dec. 7-10, 1997),769-772.

Vossen, J. L., et al., *Thin Film Processes II,* Academic Press, Inc.,(1991),1-866.

Wang, K., et al., "Very Low Temperature Deposition of Polycrystalline Silicon Films with Micro-Meter-Order Grains on SiO2", *Mat. Res. Soc. Symp. Proc., 355,* (1995),pp. 581-586.

Winters, H. F., et al., "Influence of Surface Absorption Characteristics on Reactivity Sputtered Films Grown in the Biased and Unbiased Modes", *J. Appl. Phys., 43(3),*(1972),pp. 794-799.

Yeh, J. L., et al., "Selective Copper plating of Polysilicon Surface Micromachined Structures", *Solid-State Sensor and Actuator Workshop,*(1998),pp. 248-251.

Edelstein, D., "Full Copper Wiring in a Sub-0.25 micrometer CMOS ULSI Technology", *Technical Digest., International Electron Devices Meeting,*(Dec. 7-10, 1997),773-776.

Eisenbraun, E. T., et al., "Selective and Blanket Low-Temperature Copper CVD for Multilevel Metallization in ULSI", *Conference Proceedings ULSI-VII,*(1992),5 pages.

Eldridge, J. M., "New Approaches for Investingating Corrosion in Thin Film Devices", *Electronic Packaging and Corrosion in Microelectronics, PRoceedings of ASM's Third Conference on Electric Packaging: Materials and Processes & Corrosion in Microelectronics,*Mpls, MN,(1987),283-285.

Ernst, et al., "Growth Model for Metal Films on Oxide Surface: Cu on ZnO(0001)-O", Physical Review B, 47, (May 15, 1993),13782-13798.

Fleming, J. G., et al., "Use Of Air Gap Structures To Lower Level Intralevel Capacitance", *Proceedings of the 1997 Dielectrics for ULSI Multi-level Interconnect Conference,*(1997),140.

Fukuda, T., et al., "0.5 -micrometer-Pitch Copper-Dual-Damascene Metallization Using Organic SOG (k=2.9) for 0.18-micrometer CMOS Applications", *Electron Devices Meeting, 1999, IEDM Technical Digest, International,*(1999),619-622.

Gladlfelter, W. L., et al., "Trimethylamine Complexes of Alane as Precursors for the Low-Pressure Chemical Vapor Deposition of Aluminum", Chemistry of Materials, 1, (1989),pp. 339-343.

Godbey, D. J., et al., "Copper Diffusion in Organic Polymer Resists and Inter-level Dielectrics", *Thin Solid Films, 308-309*, (1997),pp. 470-474.

Grill, A., et al., "Low dielectric constant films prepared by plasma-enhanced chemical vapor deposition from tetramethvisilane", *Journal of Applied Physics, 85(6)*, (1999),3314-3318.

Grimblot, J., et al., "II. Oxidation of Aluminum Films", *Journal of the Electrochemical Society, 129(10)*, (1982),2369-2372.

Hattangady, S.V., et al., "Integrated processing of silicon oxynitride films by combined plasma and rapid-thermal processing", *J. Vac. Sci. Technol. A, 14(6)*, (1996),pp. 3017-3023.

Hirao, S. et al., "A Novel Copper Reflow Process Using Dual Wetting Layers", *Symposium on VLSI Technology*, Digest of Technical Papers,(1997),57-58.

Hirao, S., et al., "A Novel Copper Reflow Process Using Dual Wetting Layers", *1997 Symposium on VLSI Technology*, Digest of Technical Papers,(1997),57-58.

Hirata, A., et al., "WSIN Diffusion Barrier Formed by ECR Plasma Nitridation for Copper Damascene Interconnection", *16th Solid State Devices and Materials*, (1998,pp. 260-261.

Holloway, Karen, et al., "Tantalum as a diffusion barrier between copper and silicon", *Applied Physics Letters*, 57(17), (Oct. 1990), 1736-1738.

Hu, C. K., et al., "Extendibility of Cu Damascene to 0.1 micrometer Wide Interconnections", *Mat. Res. Soc. Symp. Proc. 514*, (1998),pp. 287-292.

Len, V., et al., "An investigation into the performance of diffusion barrier materials against copper diffusion using metal-oxide-semiconductor (MOS) capacitor structures", *Solid-State Electronics, 43*, (1999),pp. 1045-1049.

Lyman, T., et al., "Metallography, Structures and Phase Diagrams", *Metals Handbook, 8*, American Society for Metals, Metals Park, Ohio,(1989),pp. 300 & 302.

Marcadal, C., "OMCVD Copper Process for Dual Damascene Metallization", *VMIC Conference*, ISMIC,(1997),93-97.

Miller, R.D., "Low Dielectric Constant Polymides and Polyimide Nanofoams", *Seventh Meeting of the DuPont Symposium on Polymides in Microelectronics*, (Sep. 1996),pp. 443-473.

Min, Jae-Sik, et al., "Metal-Organic Atomic-Layer Deposition of Titanium-Silicon-Nitride Films", *Applied Physics Letters, 75(11)*, (Sep. 13, 1999),1521-1523.

Min, J., "Metal-organic atomic-layer deposition of titanium-silicon-nitride films", *Applied Physics Letters, 75(11)*, (1999),1521-1523.

Miyake, T., et al., "Atomic Hydrogen Enhanced Reflow of Copper", *Applied Physics Letters*, 70(10), (1997),1239-1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE, 2335*, (1994),pp. 80-90.

Nakao, S., et al., "Thin and Low-Resistivity Tantalum Nitride Diffusion Barrier and Giant-Grain Copper Interconnects for Advanced ULSI Metallization", *Japaneses Journal of Applied Physics, 38(4B)*, (Apr. 1999),pp. 262-263.

Newboe, B., et al., "Applied Materials Announces First Barrier/ Seed Layer System For Copper Interconnects", *Applied Materials*, http://www.appliedmaterials.com/newsroom/pr-00103. html,(1997),pp. 1-4.

Okamoto, Y., et al., "Magnetically Excited Plasma Oxynitridation of Si at Room Temperature", *Japanese Journal of Applied Physics, 34*, (1995),L955-957.

Palleau, J., et al., "Refractory Metal Encapsulation in Copper Wiring", *Advanced Metallization for Devices and Circuits-Science, Technology and Manufacturability, Materials Research Society Symposium Proceedings, 337*, (Apr. 1994),225-231.

Park, C. W., et al., "Activation Energy for Electromigration in Cu Films", *Applied Physics Letters, 59(2)*, (Jul. 6, 1991),175-177.

Quan, Y.C., et al., "Polymer-like Organic Thin Films Deposited by Plasma Enhanced Chemical Vapor Deposition Using the Paraxylene Precursor as Low Dielectric Constant Interlayer Dielectrics for Multilevel Metallization", *Japanese Journal of Applied Physics, vol. 38, Part1, No. 3A*, (1999),1356-1358.

radzimski, Z. J., et al., "Directional Copper Deposition using d-c Magnetron Self-sputtering", *J. Vac. Sci. Technol. B, 16(3)*, (1998),pp. 1102-1106.

US 7,078,338, 07/2006, Ahn et al. (withdrawn)

* cited by examiner

SELECTIVE ELECTROLESS-PLATED COPPER METALLIZATION

RELATED APPLICATIONS

This application is a Divisional of U.S. application Ser. No. 09/483,881, filed Jan. 18, 2000, which is incorporated herein by reference.

This application is related to the following co-filed and commonly assigned applications; U.S. application Ser. No. 09/488,098, filed Jan. 18, 2000, now U.S. Pat. No. 6,429,120 and U.S. application Ser. No. 09/484,303, filed Jan. 18, 2000, both of which are hereby incorporated by reference.

FIELD OF THE INVENTION

The present invention relates generally to integrated circuits. More particularly, it pertains to structures and methods for selective electroless-plated copper metallization.

BACKGROUND OF THE INVENTION

The rapid progress in miniaturization of integrated circuits (IC) is leading to denser and finer pitched chips with ever increasing performance. In order to enhance the performance of advanced ICs, the interconnect systems are gradually migrating from aluminum-based metallurgy to higher-conductivity and more electromigration-resistant copper. Of the several schemes proposed for fabricating copper interconnects, the most promising method appears to be the Damascene process. Using this method, the trenches and vias are patterned in blanket dielectrics, and then metal is deposited into the trenches and holes in one step, followed by chemical mechanical polishing (CMP) to remove the unwanted surface metal. This leaves the desired metal in the trenches and holes, and a planarized surface for subsequent metallization. During the CMP process, especially for the via holes, more than 99% of the deposited copper is removed, and this is a very wasteful and expensive process, which includes a high usage of consumables such as pads and slurry. Furthermore, the disposition of used materials is a very important environmental issue. Therefore it is highly desirable to accomplish the copper metallization without CMP.

One approach to the formation of copper vias and metal lines includes the electroless deposition of copper. Electroless deposition of copper is used in printed circuit boards to manufacture copper lines and through holes where the line and hole dimensions are in the several tens to hundreds of microns. The is, of course, much larger than the sub-micron design rules for integrated circuit fabrication on silicon wafers. In this approach, Palladium (Pd) is often used as the activated base metal for electroless copper plating. Several different groups have shown the success of the same. For example, an article published by Bhansali and D. K. Sood, entitled, "A novel technique for fabrication of metallic structure on polyimide by selective electroless copper plating using ion implantation," Thin Solid Films, vol. 270, p. 489–492, 1995, successfully used palladium ion implantation into polyimide to seed an electroless plated copper film on the polyimide surface. An ion dose range of $1.5 \times 10^{15}$ to $1.2 \times 10^{17}$ ions/cm$^2$ was used. They also reported on the successful use of copper implantation into silicon to seed the electroless plating using a dose range of $5 \times 10^{14}$ to $6.4 \times 10^{16}$ ions/cm$^2$. (See, Bhansali, S. et al, "Selective electroless copper plating on silicon seeded by copper ion implantation", Thin Solid Films, vol. 253, no. 1–2, p. 391–394, 1994). An article published by M.-H. Kiang, et al, entitled, "Pd/Si plasma immersion ion implantation for selective electroless copper plating on SiO$_2$, Applied Physics Letters, vol. 60, no. 22, p. 2767–2769, 1992, demonstrated selective deposition of copper in SiO$_2$ trenches using Pd/Si plasma immersion ion implantation and electroless copper plating. An article published by J.-Y. Zhang et al, entitled, "Investigations of photo-induced decomposition of palladium acetate for electroless copper plating", Thin Solid Films, vol. 318, p. 234–238, 1998, illustrates photo-induced palladium decomposition of acetate performed by using argon and xenon excimer vacuum ultraviolet sources in the formation of palladium, which acted as a catalyst for subsequent copper plating by means of an electroless bath for selective copper deposition. An article published by M.-H. Bernier et al, entitled, "Laser processing of palladium for selective electroless copper plating", SPIE Proc., vol. 2045, p. 330–337, 1993 demonstrated that the direct writing of palladium features by the Ar$^+$ laser-induced pyrolytic decomposition of an organometallic palladium resins on polyimide and Si$_3$N$_4$ led to active Pd sites which were selectively copper plated. Also, as described in an article published by J.-L. Yeh et al, entitled, "Selective Copper Plating of Polysilicon surface Micromachined Structures", Technical digest of 1998 Solid-State Sensor and Actuator Workshop, Transducer Research Foundation Catalog No. 98TRF-0001, p. 248–251, 1998, Yeh et al. exposed polycrystalline silicon structures to a palladium solution that selectively activated the polysilicon structure, but not the silicon oxide or nitride layers. Upon immersion into a copper plating solution at a temperature between 55 and 80° C., the copper nuclei were initially formed on the Pd+ activated polysilicon surface. After the formation of a thin-layer copper, copper started to deposit on this thin initiated copper film. Recently, an article published by V. M. Dubin et al, entitled, "Selective and Blanket Electroless Copper Deposition for Ultralarge Scale Integration", J. Electrochem. Soc., vol. 144, no. 3, p. 898–908, 1997, disclosed a novel seeding method for electroless copper deposition on sputtered copper films with an aluminum protection layer. This seeding method consisted of (I) deposition of Cu seed layer by sputtering or evaporation, (ii) deposition of a sacrificial thin aluminum layer without breaking vacuum, (iii) etching the aluminum layer in the electroless Cu plating bath, followed by electroless Cu deposition.

Here, Dubin et al. designed and constructed a single-wafer electroless copper deposition tool with up to 200 mm wafer capability, and an electroless copper deposition process was developed. Electroless Cu films deposited at high plating rate (up to 120 nm/min) in solutions with optimized plating chemical environment exhibited low resistivity (<2 µohm cm for as deposited films), low surface roughness, and good electrical uniformity.

All of these above described methods are rather complex which means that the number of process steps involved in integrated circuit fabrication increases. The problem associated with these methods is that an increase in the number of process steps makes integrated circuit fabrication more costly. Further, none of the above described methods address or provide a resolution to the costly excess expenditure of materials and the environmental concerns when such processes are implemented to form sub-micron vias and metal lines on wafers in a conventional CMP fabrication process.

For the reasons stated above and for others which will become apparent from reading the following disclosure, structures and methods are needed which alleviate the problems associated with via and metal line fabrication processes. These structures and methods for via and metal line fabrication must be streamlined and accommodate the demand for higher performance in integrated circuits even as the fabrication design rules shrink.

SUMMARY OF THE INVENTION

The above mentioned problems associated with integrated circuit size and performance, the via and metal line formation process, and other problems are addressed by the present invention and will be understood by reading and studying the following specification. Structures and methods are provided which include a selective electroless copper metallization. The present invention provides for a multilayer copper wiring structure by electroless, selectively deposited copper in a streamlined process which will not require chemical mechanical planarization (CMP). Thus, the present invention significantly reduces the amount of deposited conductive material, e.g. copper, which is ultimately discarded according to conventional processes. This alleviates important environmental concerns regarding the disposition of used materials. Further, by avoiding the need for a CMP process step, the usage of consumables such as pads and slurry is conserved.

In particular, an illustrative embodiment of the present invention includes a novel methodology for forming copper vias on a substrate. This method includes depositing a thin film seed layer of Palladium (Pd) or Copper (Cu) on a substrate. The seed layer is deposited to a thickness of less than 15 nanometers (nm). A photolithography technique is used to define a number of via holes above the seed layer. In one embodiment, using a photolithography technique includes forming a patterned photoresist layer to define the number of via holes above the seed layer. A layer of copper is deposited over the seed layer using electroless plating filling the number of via holes to a top surface of the patterned photoresist layer. The method can be repeated any number of times depositing a second seed layer, depositing another patterned photoresist layer defining a number of conductor line openings above the second seed layer, and forming a second layer of copper using electroless plating which fills the number of conductor line openings to a top surface of the second patterned photoresist layer. The photoresist layers along with the seed layers in other regions can then be removed by ashing and a chemical mechanical planarization process is avoided. Structures formed by this novel process are similarly included within the scope of the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate includes doped and undoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductor by those skilled in the art. The following detailed description is, therefore, not to be taken in a limiting sense.

Figures 1A, 1B:
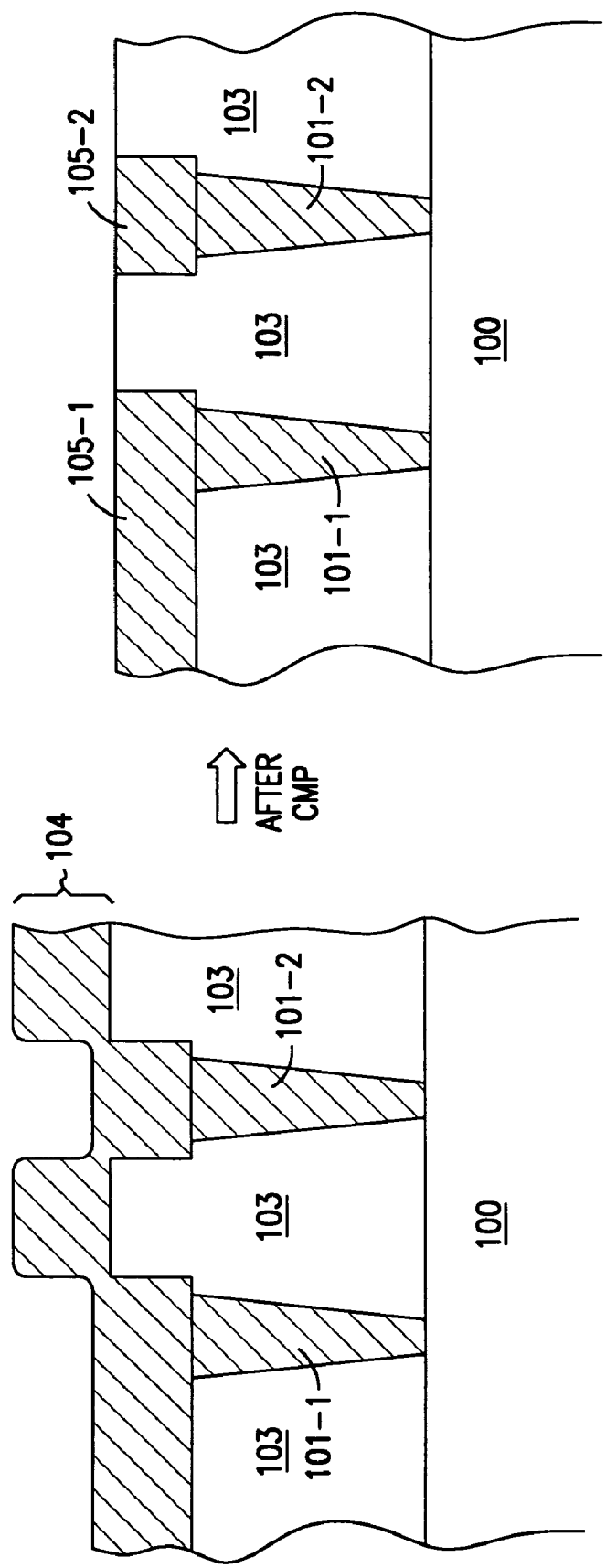
FIGS. 1A–1B illustrate an embodiment of the various processing steps for forming vias and metal lines according to the teachings of the prior art.

FIGS. 1A–1B illustrate an embodiment of the various processing steps for forming vias and metal lines according to the teachings of the prior art. As shown in FIG. 1A, a number of vias 101-1 and 101-2 are formed in an insulator material 103, e.g. silicon dioxide ($SiO_2$), contacting with a substrate 100. As one of ordinary skill in the art will recognize, any number of semiconductor devices can be formed in the substrate to which the number of vias 101-1 and 101-2 make electrical contact.

Conventionally, to form vias and aluminum wire metal lines, fabricators use a dual-damascene metallization technique, which takes its name from the ancient Damascene metalworking art of inlaying metal in grooves or channels to form ornamental patterns. The dual-damascene technique entails covering the components on a wafer with an insulative layer 103, etching small holes in the insulative layer 103 to expose portions of the components underneath in substrate 100, and subsequently etching shallow trenches from hole to hole to define a number of metal lines. Fabricators then blanket the entire insulative layer with a layer of aluminum or other conductive material and polish off the excess, leaving behind conductive vias, or contact plugs, in the holes and conductive lines in the trenches.

As shown in the prior art of FIG. 1A, a layer of copper 104 can be deposited in the holes and trenches using an electroplated copper deposition technique. As shown in FIG. 1A, the copper layer 104 fills the holes and the trenches, but also covers all of the surfaces features such the insulator material 103 used in the dual damascene process.

FIG. 1B illustrates the structure after the excess copper has been removed through a chemically mechanical planarization (CMP) process step. As shown in the prior art FIG. 1B, the CMP process step polishes the deposited layer of copper 104 down to and level with the top surface of the insulator layer 103 to form the copper vias 101-1 and 101-2 as well as copper metal lines 105-1 and 105-2. One of ordinary skill in the art will understand, upon viewing the fabrication process illustrated in FIGS. 1A and 1B, the wastefulness in the amount of copper which is discarded in the CMP process step.

Method of the Present Invention

Figure 2A:
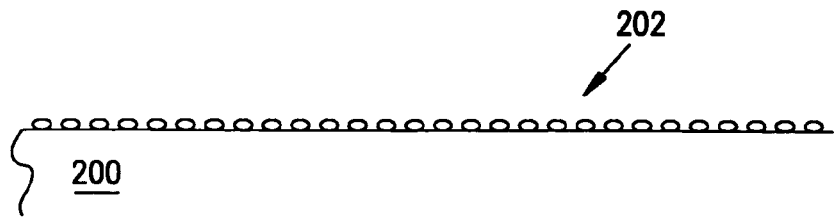
FIGS. 2A–2K illustrate an embodiment of the various processing steps for a selective electroless-plated copper metallization according to the teachings of the present invention.

FIGS. 2A through 2K illustrate a novel methodology for a selective electroless-plated copper metallization according to the teachings of the present invention. Specifically, FIG. 2A through 2K illustrate a method for forming a multilayer copper (Cu) wiring structure on a substrate. The methodology of the present invention avoids the need for a chemical mechanical planarization (CMP) process step in forming the same. As shown in FIG. 2A, a seed layer, or first seed layer, 202 is deposited on a substrate 200. In one embodiment, depositing the first seed layer 202 on the substrate 200 includes depositing a thin film of Palladium (Pd) on the substrate 200. In another embodiment, depositing the first seed layer 202 on the substrate 200 includes depositing a thin film of Copper (Cu) on the substrate. The seed layer 202 is deposited to have a thickness of less than 15 nanometers (nm). In one exemplary embodiment, the seed layer 202 is deposited to form a barely continuous film in the thickness range of 3 to 10 nm. In another exemplary embodiment, the seed layer 202 is deposited such that the seed layer possesses a discontinuous island structure in the thickness range of 3 to 10 nm. In one embodiment, the seed layer 202 is deposited using a physical vapor deposition process. For example, in one embodiment, the seed layer 202 is deposited using a sputtering deposition technique. In another embodiment, the seed layer 202 is deposited using an evaporation deposition technique. One of ordinary skill in the art will understand, upon reading this disclosure, the manner in which such physical vapor deposition processes can be performed to form the seed layer 202 described herein.

Figure 2B:
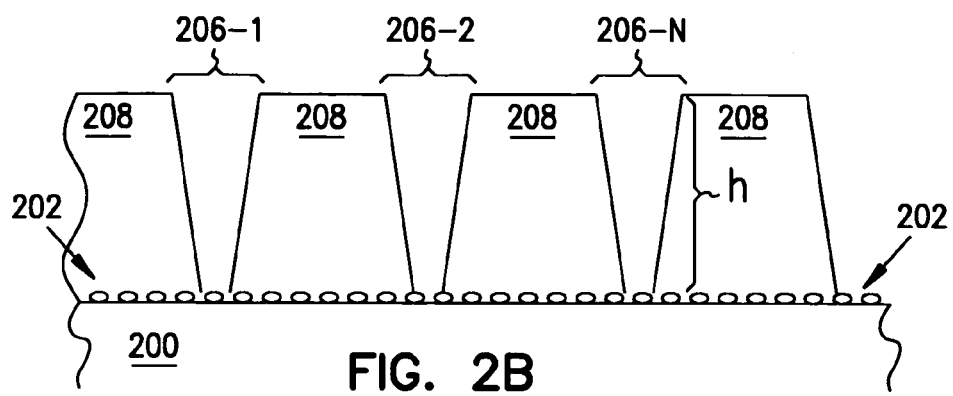

FIG. 2B illustrates the structure following the next sequence of processing steps. In FIG. 2B, a photolithography technique is used to define a number of via holes, or openings, 206-1, 206-2, . . . , 206-N, above the seed layer 202 on the substrate 200. As one of ordinary skill in the art will understand upon reading this disclosure, using a photolithography technique to define a number of holes 206-1, 206-2, . . . , 206-N, includes patterning a photoresist layer 208 to define the number via holes, or openings, 206-1, 206-2, . . . , 206-N over the seed layer 202. One of ordinary skill in the art will also understand upon reading this disclosure, the manner of forming the patterned photoresist layer, or first patterned photoresist layer, 208. For example, a photoresist layer can be deposited over the seed layer 202 using any suitable technique, e.g. by spin coating. Then the photoresist can be masked, exposed, and washed to define the number of via holes, or openings, 206-1, 206-2, . . . , 206-N to the seed layer 202. One of ordinary skill in the art will further understand, upon reading this disclosure, that the thickness of the photoresist layer 202 is scalable. That is, the deposition of the photoresist layer 208 is controllable such that the photoresist thickness can be set at a predetermined height (h1). Thus, the scalable thickness of the photoresist layer 208 determines a height (h1), or depth (h1) for the number of via holes, or openings, 206-1, 206-2, . . . , 206-N. The structure is now as appears in FIG. 2B.

Figure 2C:
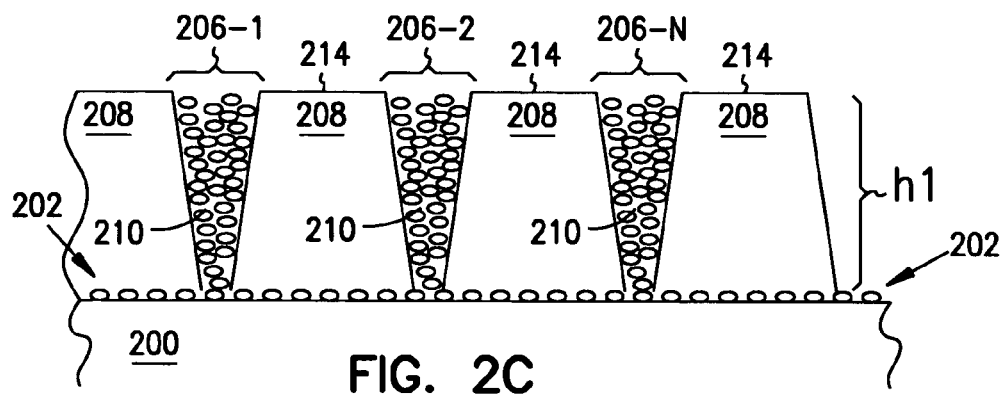

FIG. 2C illustrates the structure following the next sequence of processing steps. In FIG. 2C, a layer of copper, first layer of copper, or first level of copper vias 210 is deposited over the seed layer 202 using electroless plating. One of ordinary skill in the art will understand upon reading this disclosure the various manner in which the layer of copper, first layer of copper, or first level of copper vias 210 can be deposited over the seed layer 202 using electroless plating. According to the teachings of the present invention, the layer of copper, first layer of copper, or first level of copper vias 210 is formed in the number of via holes, or openings, 206-1, 206-2, . . . , 206-N. Forming layer of copper, first layer of copper, or first level of copper vias 210 includes filling the number of via holes, or openings, 206-1, 206-2, . . . , 206-N to a top surface 214 of the first patterned photoresist layer 208. According to the teachings of the present invention depositing the layer of copper, first layer of copper, or first level of copper vias 210 over the seed layer 202 is such that the layer of copper, first layer of copper, or first level of copper vias 210 form on the seed layer 202 but not on the patterned photoresist layer 208. The structure is now as appears in FIG. 2C.

Figure 2D:
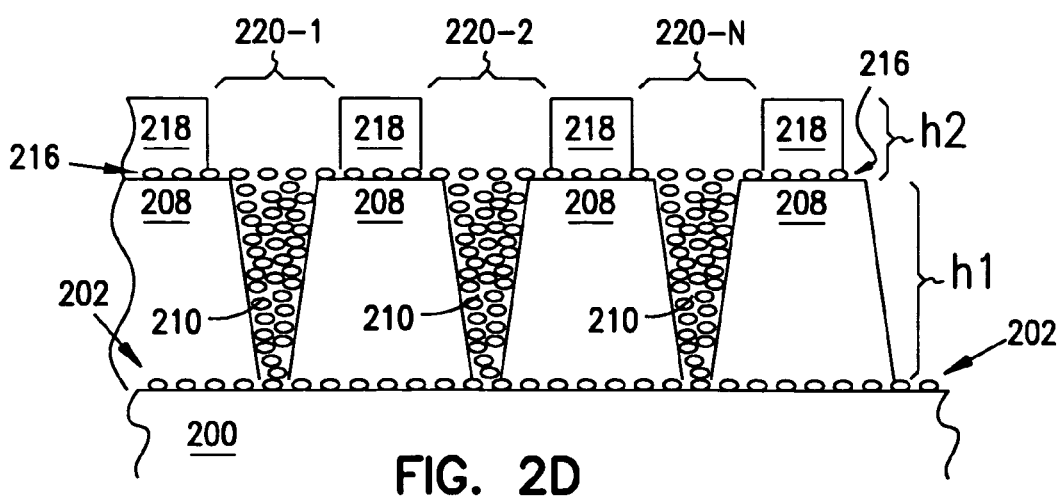

FIG. 2D illustrates the structure following the next sequence of processing steps. In FIG. 2D, another seed layer, or second seed layer, 216 is deposited on the first layer of copper, or first level of copper vias 210 and the top surface 214 of the first patterned photoresist layer 208. In one embodiment, depositing the second seed layer 216 on the first layer of copper, or first level of copper vias 210 and the top surface 214 of the first patterned photoresist layer 208 includes depositing a thin film of Palladium (Pd). In another embodiment, depositing the second seed layer 216 on the first layer of copper, or first level of copper vias 210 and the top surface 214 of the first patterned photoresist layer 208 includes depositing a thin film of Copper (Cu). As before, the second seed layer 216 is deposited to have a thickness of less than 15 nanometers (nm). In one exemplary embodiment, the second seed layer 216 is deposited to form a barely continuous film in the thickness range of 3 to 10 nm. In another exemplary embodiment, the second seed layer 216 is deposited such that the second seed layer 216 possesses a discontinuous island structure 216 having an island thickness in the range of 3 to 10 nm.

In one embodiment, the second seed layer 216 is deposited using a physical vapor deposition process. For example, in one embodiment, the second seed layer 216 is deposited using a sputtering deposition technique. In another embodiment, the second seed layer 216 is deposited using an evaporation deposition technique. One of ordinary skill in the art will understand, upon reading this disclosure, the manner in which such physical vapor deposition processes can be performed to form the second seed layer 216 described herein.

A second patterned photoresist layer 218 is deposited above the second seed layer 216, which defines a number of conductor line openings 220-1, 220-2, . . . , 220-N. In one embodiment, depositing the second patterned photoresist layer 218 which defines a number of conductor line openings 220-1, 220-2, . . . , 220-N, or first level metal line openings 220-1, 220-2, . . . , 220-N. In one embodiment, the number of conductor line openings 220-1, 220-2, . . . , 220-N are defined to form a number of conductor line openings 220-1, 220-2, . . . , 220-N having a near minimum width and spacing. As one of ordinary skill in the art will understand upon reading this disclosure, this insures a sufficient space in the structure for a subsequent removal of the photoresist layers, e.g. first patterned photoresist layer 208, on lower levels. This consideration is described in greater detail in a co-pending, co-filed application, Ser. No. 09/584,157, filed May 31, 2000 and now U.S. Pat. No. 6,674,167 dated Jan. 6, 2004, entitled, "A Multilevel Copper Interconnect with Double Insulation for ULSI." One of ordinary skill in the art will understand upon reading this disclosure, the manner of forming the second patterned photoresist layer 218. For example, a photoresist layer can be deposited over the second seed layer 216 using any suitable technique, e.g. by spin coating. Then the photoresist can be masked, exposed, and washed to define the number of conductor line openings 220-1, 220-2, . . . , 220-N to the second seed layer 216. One of ordinary skill in the art will further understand, upon reading this disclosure, that the thickness of the second patterned photoresist layer 218 is scalable. That is, the deposition of the photoresist layer 218 is controllable such that the photoresist thickness can be set at a predetermined height (h2). Thus, the scalable thickness of the second patterned photoresist layer 218 determines a height (h2), or depth (h2) for the number of conductor line openings 220-1, 220-2, ..., 220-N. According to the teachings of the present invention, depositing the second patterned photoresist layer 218 includes depositing the second patterned photoresist layer 218 to have a thickness (h2) which is less than a thickness (h1) of the first patterned photoresist layer 208. That is, the thickness (h2) of the second patterned photoresist layer 218, and consequently a depth (h2) of the number of conductor line openings 220-1, 220-2, ..., 220-N, is thinner than a depth (h1) of the first level of copper vias 210 defined by the thickness (h1) of the first patterned photoresist layer 208. The structure is now as appears in FIG. 2D.

Figure 2E:
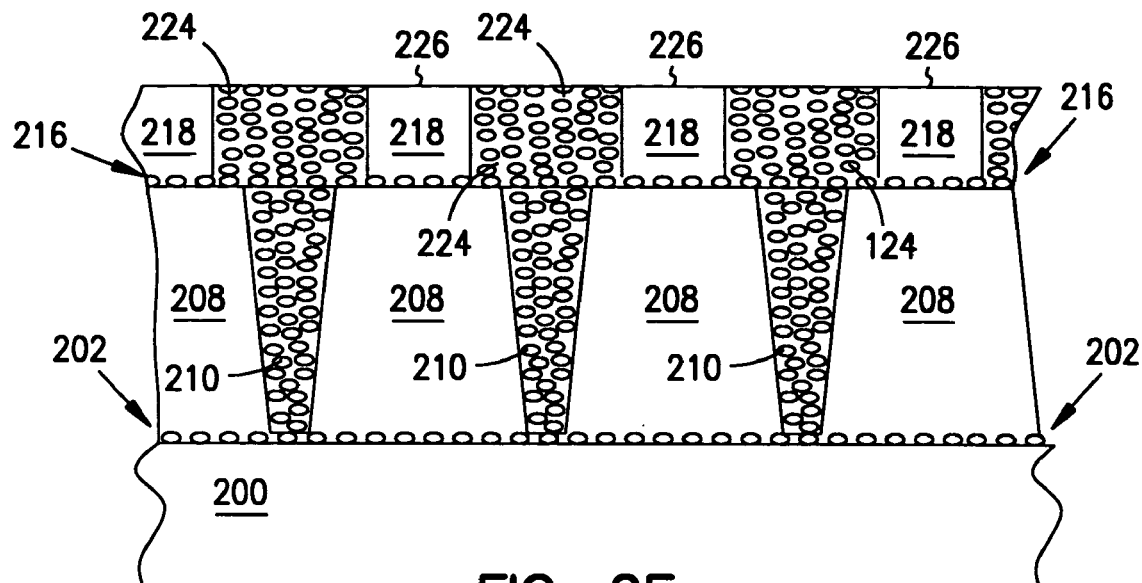

FIG. 2E illustrates the structure following the next sequence of processing steps. In FIG. 2E, another layer of copper, second layer of copper, or first level of conductor lines 224 is deposited or formed in the number of conductor line openings 220-1, 220-2, ..., 220-N using electroless plating. One of ordinary skill in the art will understand upon reading this disclosure the various manner in which this next layer of copper, second layer of copper, or first level of conductor lines 224 can be deposited in the number of conductor line openings 220-1, 220-2, ..., 220-N using electroless plating. According to the teachings of the present invention, forming this next layer of copper, second layer of copper, or first level of conductor lines 224 includes filling the number of conductor line openings 220-1, 220-2, ..., 220-N to a top surface 226 of the second patterned photoresist layer 218. According to the teachings of the present invention depositing this next layer of copper, second layer of copper, or first level of conductor lines 224 over the second seed layer 216 is such that this next layer of copper, second layer of copper, or first level of conductor lines 224 form on the second seed layer 216 but not on the second patterned photoresist layer 218. The structure is now as appears in FIG. 2E.

Figure 2F:
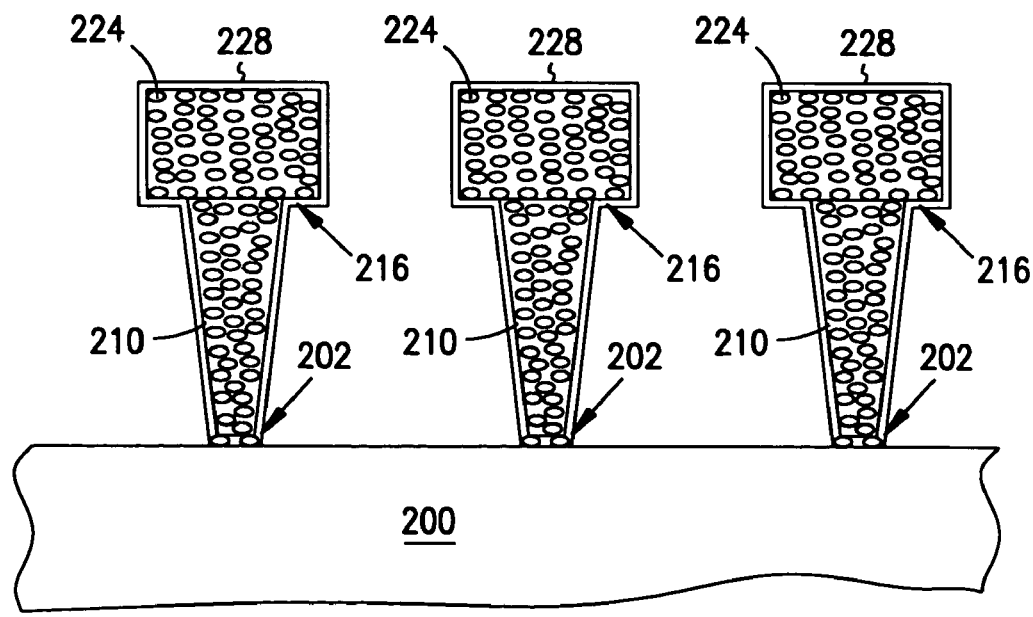

FIG. 2F illustrates the structure after the following sequence of processing steps. In FIG. 2F, according to the teachings of the present invention, the first patterned photoresist layer 208 and the second patterned photoresist layer 218 are removed. In one exemplary embodiment, removing the first patterned photoresist layer 208 and the second patterned photoresist layer 218 includes removing the first patterned photoresist layer 208 and the second patterned photoresist layer 218 using an oxygen plasma etching. According to the teachings of the present invention, the method further includes removing the first and second seed layers 202 and 216 with the photoresist layers 208 and 218 from areas on the substrate 200 which are not beneath the number of copper vias 210 or between the conductive metal lines 224 and the vias 210. As one of ordinary skill in the art will understand from reading this disclosure, this is due the present inventions novel methodology where the seed layers, 202 and 216, are deposited to have a thickness of less than 15 nanometers (nm), thus forming a barely continuous thin film and/or discontinuous island structure. Other suitable techniques for removing the first patterned photoresist layer 208 and the second patterned photoresist layer 218 can similarly be employed.

At this point, a thin diffusion barrier 228 can be formed on the exposed first level of copper vias 210 and first level of conductor lines 224 as well as the remaining, exposed first and second seed layers, 202 and 216 respectively, located between the substrate, vias, and metal lines. According to the teachings of the present invention, forming a thin diffusion barrier 228 includes forming a thin diffusion barrier of Tungsten Silicon Nitride (WSi$_x$N$_y$) 228 having a thickness of less than 8 nanometers (nm). In one embodiment, according to the teachings of the present invention, forming a thin diffusion barrier of Tungsten Silicon Nitride (WSi$_x$N$_y$) 228 having a thickness of less than 8 nanometers (nm) includes forming a graded composition of WSi$_x$, where x varies from 2.0 to 2.5, and nitriding the graded composition of WSi$_x$. The details of forming a thin diffusion barrier 228, as presented above, are further described in detail in a co-filed, co-pending application; Ser. No. 09/484,303, filed Jan. 18, 2000 entitled, "Method for Making Copper Interconnects in Integrated Circuits," which is hereby incorporated by reference. The structure is now as appears in FIG. 2F.

As one of ordinary skill in the art will understand upon reading this disclosure, forming additional or subsequent layer/levels of conductive vias and metallization lines are also included within the scope of the present invention. In this scenario, the removal of the first patterned photoresist layer 208 and the second patterned photoresist layer 218 can be delayed until these subsequent layer are completed, the invention is not so limited. That is, if subsequent layers are to be fabricated, the steps illustrated in FIG. 2F will be delayed and the process will repeat the sequence provided in FIG. 2A–2E.

Figure 2G:
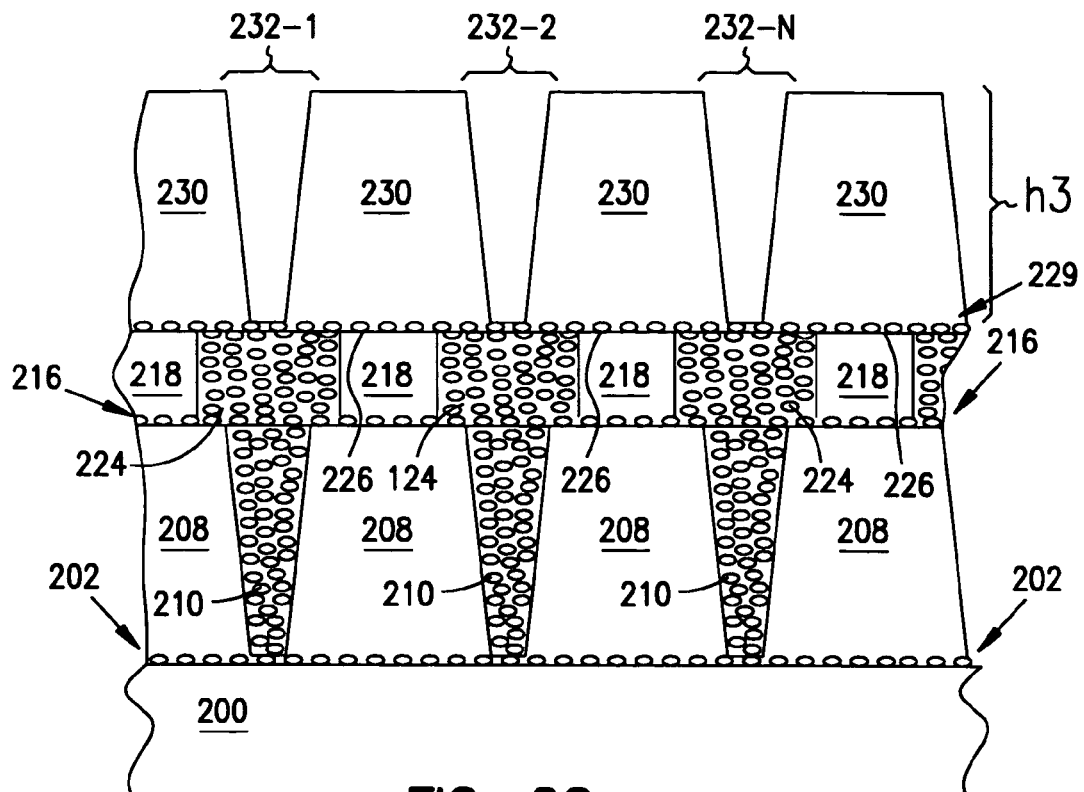

FIG. 2G illustrates the forming of subsequent via and metallization layers prior to the process steps of FIG. 2F and continuing in sequence after the number of process steps completed in FIG. 2E. For example, FIG. 2G shows that in forming subsequent conductive via and metallization layers, another seed layer, or third seed layer, 229 is deposited on the second layer of copper, or first level of conductor lines 224 and the top surface 226 of the second patterned photoresist layer 218. In one embodiment, depositing the third seed layer 229 on the second layer of copper, or first level of conductor lines 224 and the top surface 226 of the second patterned photoresist layer 218 includes depositing a thin film of Palladium (Pd). In another embodiment, depositing the third seed layer 229 on the second layer of copper, or first level of conductor lines 224 and the top surface 226 of the second patterned photoresist layer 218 includes depositing a thin film of Copper (Cu). As before, the third seed layer 229 is deposited to have a thickness of less than 15 nanometers (nm). In one exemplary embodiment, the third seed layer 229 is deposited to form a barely continuous film in the thickness range of 3 to 10 nm. In another exemplary embodiment, the third seed layer 229 is deposited such that the third seed layer 229 possesses a discontinuous island structure 229 having an island thickness in the range of 3 to 10 nm.

In one embodiment, the third seed layer 229 is deposited using a physical vapor deposition process. For example, in one embodiment, the third seed layer 229 is deposited using a sputtering deposition technique. In another embodiment, the third seed layer 229 is deposited using an evaporation deposition technique. One of ordinary skill in the art will understand, upon reading this disclosure, the manner in which such physical vapor deposition processes can be performed to form the third seed layer 229 described herein.

In FIG. 2G, a third patterned photoresist layer 230 is deposited above the third seed layer 229, which defines a number of via holes, or openings, 232-1, 232-2, ..., 232-N to the third seed layer 229. One of ordinary skill in the art will understand upon reading this disclosure, the manner of forming the third patterned photoresist layer 230. For example, a photoresist layer can be deposited over the third seed layer 229 using any suitable technique, e.g. by spin coating. Then the photoresist can be masked, exposed, and washed to define the number of via holes, or openings, 232-1, 232-2, ..., 232-N to the third seed layer 229. One of ordinary skill in the art will further understand, upon reading this disclosure, that the thickness of the second patterned photoresist layer 218 is scalable. That is, the deposition of the photoresist layer 230 is controllable such that the photoresist thickness can be set at a predetermined height (h3). Thus, the scalable thickness of the second patterned photoresist layer 230 determines a height (h3) for the number of via holes, or openings, 232-1, 232-2, . . . , 232-N. The structure is now as appears in FIG. 2G.

Figure 2H:
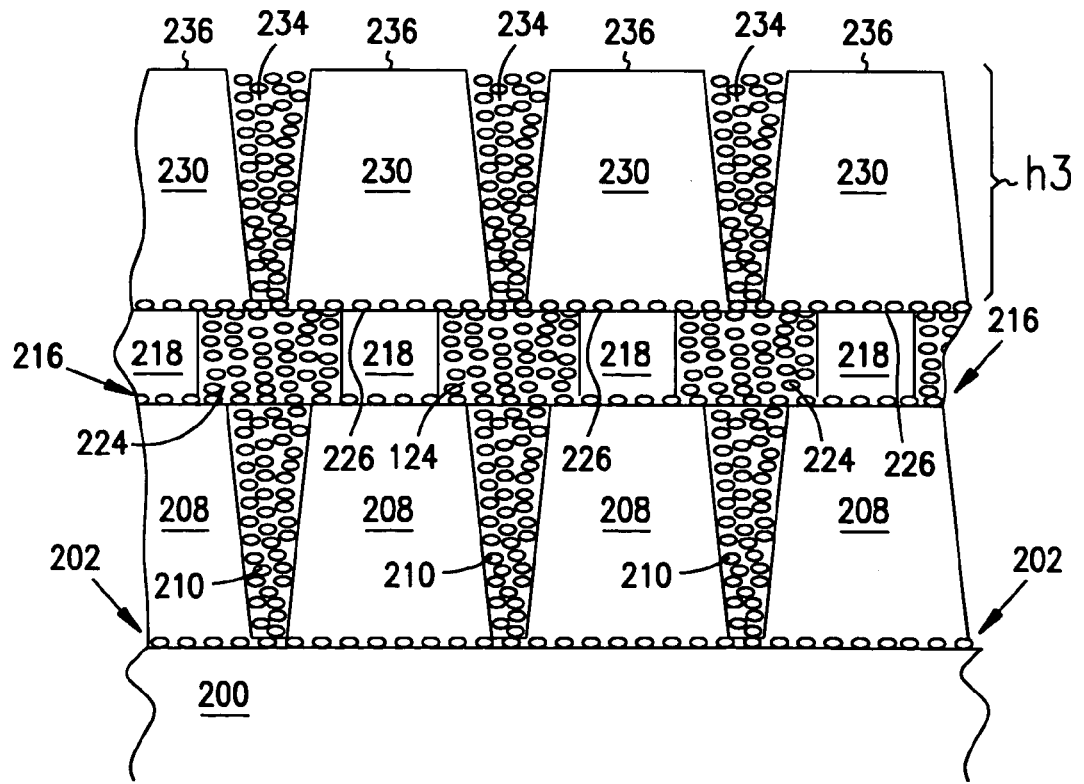

FIG. 2H illustrates the structure continuing on from the process steps included in FIG. 2G. In FIG. 2H, another layer of copper, third layer of copper, or second level of copper vias 234 is deposited or formed over the third seed layer 229 using electroless plating. One of ordinary skill in the art will understand upon reading this disclosure the various manner in which the third layer of copper, or second level of copper vias 234 can be deposited over the third seed layer 229 using electroless plating. According to the teachings of the present invention, the third layer of copper, or second level of copper vias 234 is formed in the number of via holes, or openings, 232-1, 232-2, . . . , 232-N to the third seed layer 229. Forming the third layer of copper, or second level of copper vias 234 includes filling the number of via holes, or openings, 232-1, 232-2, . . . , 232-N to a top surface 236 of the third patterned photoresist layer 230. According to the teachings of the present invention, depositing third layer of copper, or second level of copper vias 234 over the third seed layer 229 is such that the third layer of copper, or second level of copper vias 234 form on the third seed layer 229 but not on the third patterned photoresist layer 230. The structure is now as appears in FIG. 2H.

Figure 2I:
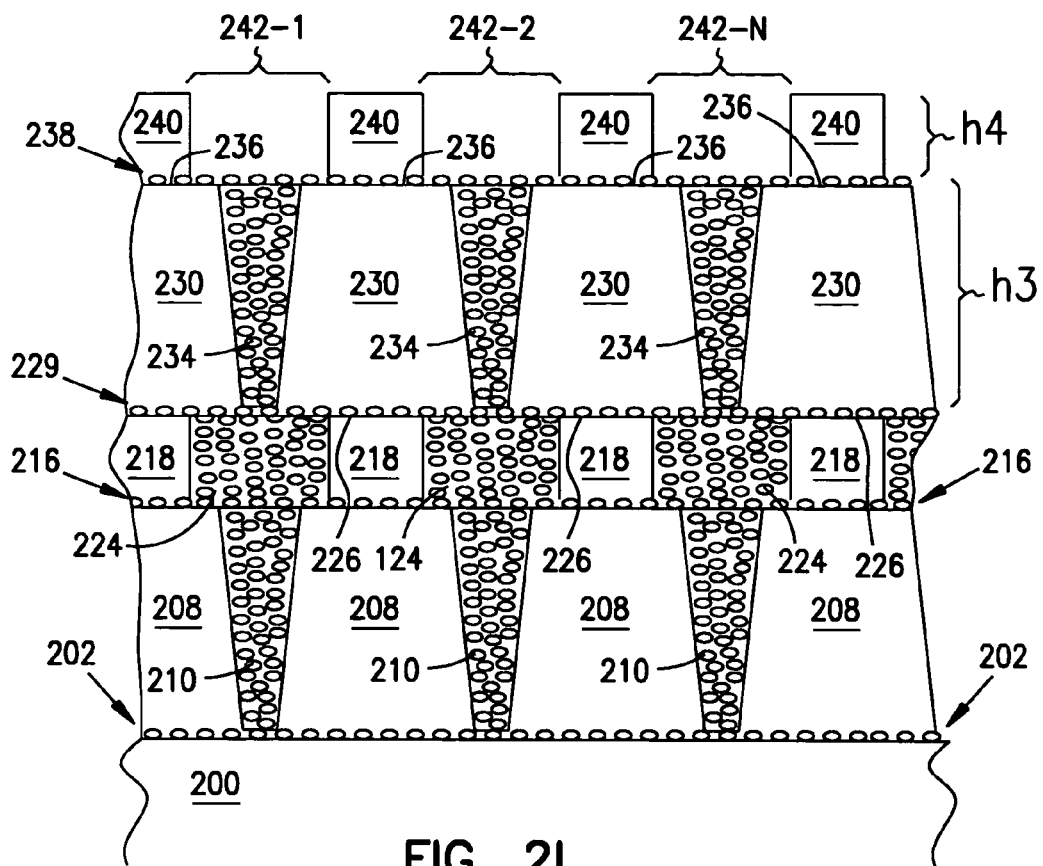

FIG. 2I illustrates the structure following the next sequence of processing steps. In FIG. 2I, another seed layer, or fourth seed layer, 238 is deposited on the third layer of copper, or second level of copper vias 234 and the top surface 236 of the third patterned photoresist layer 230. In one embodiment, depositing the fourth seed layer 238 on the third layer of copper, or second level of copper vias 234 and the top surface 236 of the third patterned photoresist layer 230 includes depositing a thin film of Palladium (Pd). In another embodiment, depositing the fourth seed layer 238 on the third layer of copper, or second level of copper vias 234 and the top surface 236 of the third patterned photoresist layer 230 includes depositing a thin film of Copper (Cu). As before, the fourth seed layer 238 is deposited to have a thickness of less than 10 nanometers (nm). In one exemplary embodiment, the fourth seed layer 238 is deposited to form a barely continuous film in the thickness range of 3 to 10 nm. In another exemplary embodiment, the fourth seed layer 238 is deposited such that the fourth seed layer 238 possesses a discontinuous island structure 238 having an island thickness in the range of 3 to 10 nm.

In one embodiment, the fourth seed layer 238 is deposited using a physical vapor deposition process. For example, in one embodiment, the fourth seed layer 238 is deposited using a sputtering deposition technique. In another embodiment, the fourth seed layer 238 is deposited using an evaporation deposition technique. One of ordinary skill in the art will understand, upon reading this disclosure, the manner in which such physical vapor deposition processes can be performed to form the fourth seed layer 238 described herein.

A fourth patterned photoresist layer 240 is deposited above the fourth seed layer 238, which defines a number of conductor line openings 242-1, 242-2, . . . , 242-N. In one embodiment, depositing the fourth patterned photoresist layer 240 which defines a number of conductor line openings 242-1, 242-2, . . . , 242-N includes defining a number of second level metal line openings 242-1, 242-2, . . . , 242-N. In one embodiment, the second number of conductor line openings 242-1, 242-2, . . . , 242-N are defined to form a number of conductor line openings 242-1, 242-2, . . . , 242-N having a near minimum width and spacing. As one of ordinary skill in the art will understand upon reading this disclosure, this insures a sufficient space in the structure for a subsequent removal of the photoresist layers, e.g. first, second, and third patterned photoresist layer 208, 218, and 230 on lower levels. This consideration is described in greater detail in a co-pending, co-filed application, Ser. No. 09/454,157, filed May 31, 2000, and now U.S. Pat. No. 6,674,167 entitled, "A Multilevel Copper Interconnect with Double Insulation for ULSI." One of ordinary skill in the art will understand upon reading this disclosure, the manner of forming the fourth patterned photoresist layer 240. For example, a photoresist layer can be deposited over the fourth seed layer 238 using any suitable technique, e.g. by spin coating. Then the photoresist can be masked, exposed, and washed to define the number of conductor line openings 242-1, 242-2, . . . , 242-N to the fourth seed layer 238. One of ordinary skill in the art will further understand, upon reading this disclosure, that the thickness of the fourth patterned photoresist layer 240 is scalable. That is, the deposition of the fourth patterned photoresist layer 240 is controllable such that the photoresist thickness can be set at a predetermined height (h4). Thus, the scalable thickness of the fourth patterned photoresist layer 240 determines a height (h4) for the number of conductor line openings 242-1, 242-2, . . . , 242-N. According to the teachings of the present invention, depositing the fourth patterned photoresist layer 240 includes depositing the fourth patterned photoresist layer 240 to have a thickness (h4) which is less than a thickness (h3) of the third patterned photoresist layer 230. That is, the thickness (h3) of the third patterned photoresist layer 230 is thinner than a depth (h3) of the second level of copper vias 234 defined by the thickness (h3) of the third patterned photoresist layer 230. The structure is now as appears in FIG. 2I.

Figure 2J:
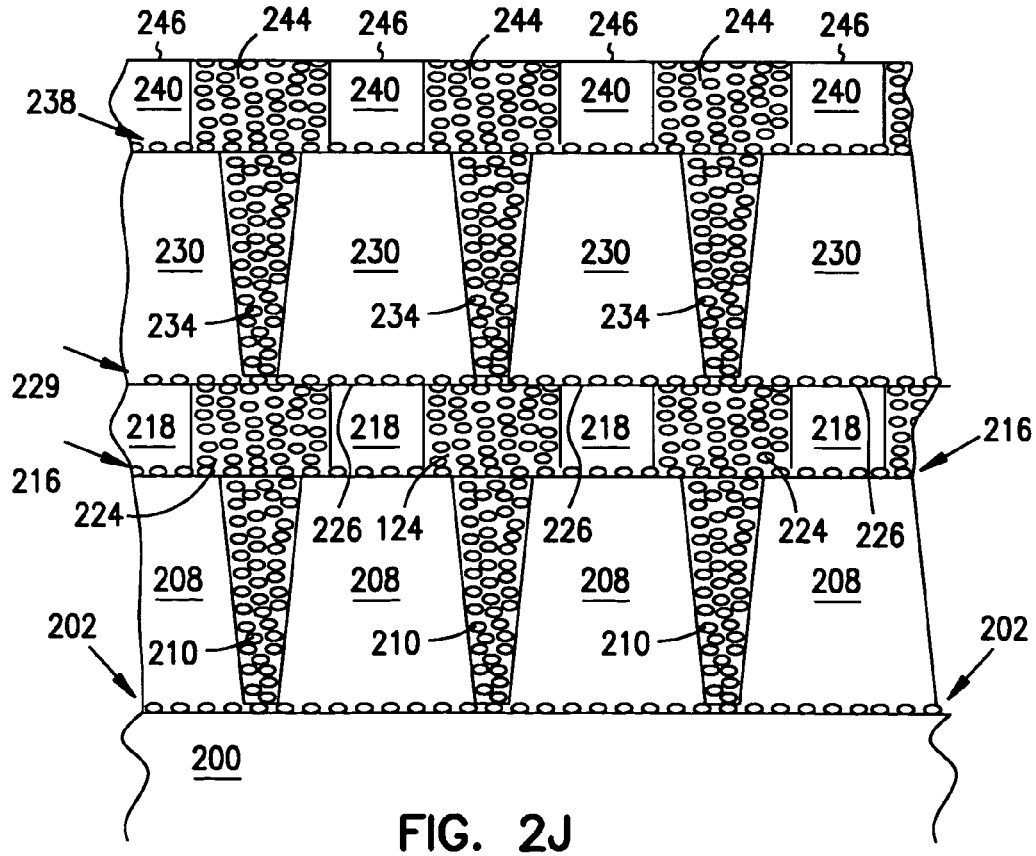

FIG. 2J illustrates the structure following the next sequence of processing steps. In FIG. 2E, another layer of copper, fourth layer of copper, or second level of conductor lines 244 is deposited or formed in the number of conductor line openings 242-1, 242-2, . . . , 242-N using electroless plating. One of ordinary skill in the art will understand upon reading this disclosure the various manner in which this fourth layer of copper, or second level of conductor lines 244 can be deposited in the number of conductor line openings 242-1, 242-2, . . . , 242-N using electroless plating. According to the teachings of the present invention, forming this fourth layer of copper, or second level of conductor lines 244 includes filling the number of conductor line openings 242-1, 242-2, . . . , 242-N to a top surface 246 of the fourth patterned photoresist layer 240. According to the teachings of the present invention depositing this fourth layer of copper, or second level of conductor lines 244 over the fourth seed layer 238 is such that this fourth layer of copper, or second level of conductor lines 244 form on the fourth seed layer 238 but not on the fourth patterned photoresist layer 240. The structure is now as appears in FIG. 2J.

Figure 2K:
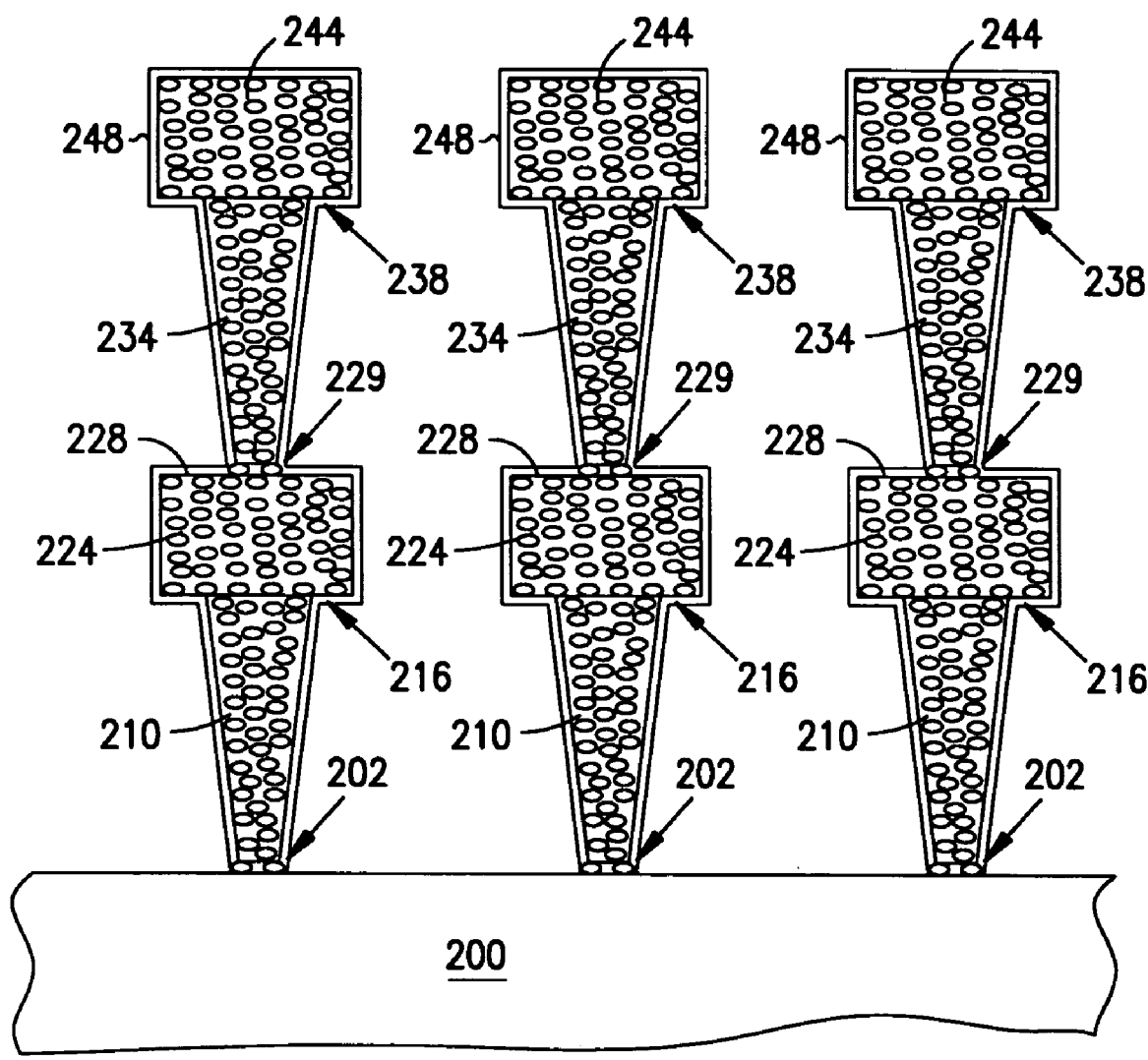

FIG. 2K illustrates the structure after the following sequence of processing steps. In FIG. 2K, according to the teachings of the present invention, the first, second, third, and fourth patterned photoresist layers 208, 218, 230, and 240 are removed. In one exemplary embodiment, removing the first, second, third, and fourth patterned photoresist layers 208, 218, 230, and 240 includes removing the first, second, third, and fourth patterned photoresist layers 208, 218, 230, and 240 using an oxygen plasma etching. According to the teachings of the present invention, the method further includes removing the first, second, third, and fourth seed layers, 202, 216, 229 and 238 respectively, with the photoresist layers from areas on the substrate which are not beneath the number of copper vias or between the conductive metal lines and the vias. As one of ordinary skill in the art will understand from reading this disclosure, this is due the present inventions novel methodology where the seed layers, 202, 216, 229 and 238, are deposited to have a thickness of less than 15 nanometers (nm), thus forming a barely continuous thin film and/or discontinuous island structure. Other suitable techniques for removing the first, second, third, and fourth patterned photoresist layers 208, 218, 230, and 240 can similarly be employed. As one of ordinary skill in the art will further understand upon reading this disclosure, the first, second, third, and fourth patterned photoresist layers 208, 218, 230, and 240 can be removed at earlier or later stages of a fabrication process, as described herein, depending on the number of via and metal levels to be formed.

At this point, or as could equally be performed at an earlier or later stage depending on when the photoresist layers are removed, a thin diffusion barrier 248 can be formed on the exposed first and second level of copper vias 210, 234 and the exposed first and second level of conductor lines 224, 244 as well as the remaining, exposed first, second, third, and fourth seed layers, 202, 216, 229 and 238 respectively, located between the substrate, vias, and metal lines. According to the teachings of the present invention, forming a thin diffusion barrier 248 includes forming a thin diffusion barrier of Tungsten Silicon Nitride ($WSi_xN_y$) 248 having a thickness of less than 8 nanometers (nm). In one embodiment, according to the teachings of the present invention, forming a thin diffusion barrier of Tungsten Silicon Nitride ($WSi_xN_y$) 248 having a thickness of less than 8 nanometers (nm) includes forming a graded composition of $WSi_x$, where x varies from 2.0 to 2.5, and nitriding the graded composition of $WSi_x$. The details of forming a thin diffusion barrier 228, as presented above, are further described in detail in a co-filed, co-pending application; Ser. No. 09/484,303, filed Jan. 18, 2000, entitled, "Method for Making Copper Interconnects in Integrated Circuits," which is hereby incorporated by reference. The structure is now as appears in FIG. 2K.

Structure

Figure 3:
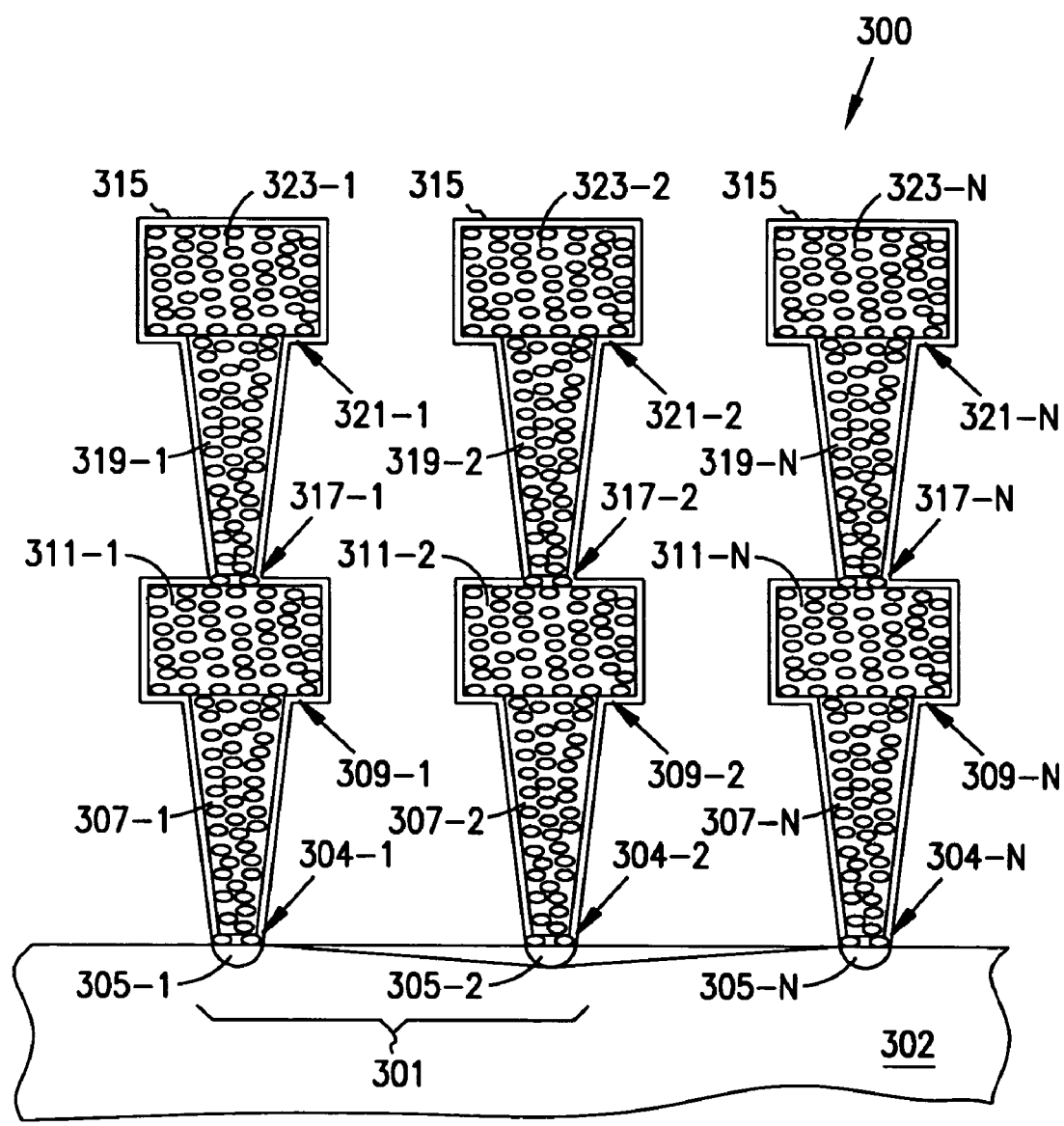
FIG. 3 is an illustration of an integrated circuit formed according to the teachings of the present invention.

FIG. 3 is an illustration of an integrated circuit 300 formed according to the teachings of the present invention. According to the teachings of the present invention, the integrated circuit 300 includes a multilayer copper wiring structure. As shown in FIG. 3, the integrated circuit 300 includes at least one semiconductor device 301 formed in a substrate 302. A first number of seed layers 304-1, 304-2, . . . , 304-N are formed on a number of portions 305-1, 305-2, . . . , 305-N of the at least one semiconductor device. As one of ordinary skill in the art will understand upon reading this disclosure the number of portions 305-1, 305-2, . . . , 305-N of the at least one semiconductor device 301 include the number of portions 305-1, 305-2, . . . , 305-N of a semiconductor device 301 which require electrical contact to subsequent integrated circuit layers formed above the semiconductor device 301. For example, the at least one semiconductor device 301 can include at least one transistor 301 which has a source and a drain region. In this scenario, the number of portions 305-1, 305-2, . . . , 305-N of a semiconductor device 301 which require electrical contact to subsequent integrated circuit layers formed above the semiconductor device 301 include the source and the drain regions 305-1, 305-2, . . . , 305-N.

As shown in FIG. 3, a number of copper vias 307-1, 307-2, . . . , 307-N, or first level of copper vias 307-1, 307-2, . . . , 307-N, are formed above and contact with the first number of seed layers 304-1, 304-2, . . . , 304-N. According to the teachings of the present invention, the first number of seed layers 304-1, 304-2, . . . , 304-N include a thin film of Palladium (Pd) or Copper. Further, the first number of seed layers 304-1, 304-2, . . . , 304-N have a thickness of less than 15 nanometers (nm). In one embodiment, the first number of seed layers 304-1, 304-2, . . . , 304-N includes a first number of seed layers 304-1, 304-2, . . . , 304-N having a discontinuous island structure with an island thickness in the range of 3 to 10 nanometers.

A second number of seed layers 309-1, 309-2, . . . , 309-N are formed on the number of copper vias 307-1, 307-2, . . . , 307-N. According to the teachings of the present invention, the second number of seed layers 309-1, 309-2, . . . , 309-N include a thin film of Palladium (Pd) or Copper. Further, the second number of seed layers 309-1, 309-2, . . . , 309-N have a thickness of less than 15 nanometers (nm). In one embodiment, the second number of seed layers 309-1, 309-2, . . . , 309-N includes a second number of seed layers 309-1, 309-2, . . . , 309-N having a discontinuous island structure with an island thickness in the range of 3 to 10 nanometers.

A number of conductor metal lines 311-1, 311-2, . . . , 311-N, or first level of conductor metal lines 311-1, 311-2, . . . , 311-N, are formed above and contact with the second number of seed layers 309-1, 309-2, . . . , 309-N. In one embodiment, the first level of conductor metal lines 311-1, 311-2, . . . , 311-N includes a number of copper metal lines 311-1, 311-2, . . . , 311-N. In one embodiment, as shown in FIG. 3, the integrated circuit 300 further includes a thin diffusion barrier 315 covering the number of copper vias 307-1, 307-2, . . . , 307-N, the number of conductor metal lines 311-1, 311-2, . . . , 311-N, and the first and the second number of seed layers, 304-1, 304-2, . . . , 304-N, and 309-1, 309-2, . . . , 309-N respectively. According to the teachings of the present invention, the thin diffusion barrier 315 has a thickness of less than 8.0 nanometers (nm). In one embodiment, the thin diffusion barrier has a thickness in the range of 2.0 to 6.0 nanometers. In one embodiment, the thin diffusion barrier 315 includes a graded composition of Tungsten Silicon Nitride ($WSi_xN_y$), and wherein x varies from 2.0 to 2.5.

In one embodiment, as shown in FIG. 3, the integrated circuit, or multilayer copper wiring structure 300 includes a third number of seed layers 317-1, 317-2, . . . , 317-N, including a thin film of Palladium (Pd) or Copper, are formed on the first level of copper metal lines 311-1, 311-2, . . . , 311-N, or first level of conductor metal lines 311-1, 311-2, . . . , 311-N. Further, the third number of seed layers 317-1, 317-2, . . . , 317-N have a thickness of less than 15 nanometers (nm). In one embodiment, the third number of seed layers 317-1, 317-2, . . . , 317-N includes a third number of seed layers 317-1, 317-2, . . . , 317-N having a discontinuous island structure with an island thickness in the range of 3 to 10 nanometers. A second level of copper vias 319-1, 319-2, . . . , 319-N are formed above and contacting the third number of seed layers 317-1, 317-2, . . . , 317-N. A fourth number of seed layers 321-1, 321-2, . . . , 321-N, including a thin film of Palladium (Pd) or Copper, are formed on the second level of copper vias 319-1, 319-2, . . . , 319-N. In one embodiment, the fourth number of seed layers 321-1, 321-2, . . . , 321-N includes a fourth number of seed layers 321-1, 321-2, . . . , 321-N having a discontinuous island structure with an island thickness in the range of 3 to 10 nanometers. A second level of copper metal lines 323-1, 323-2, . . . , 323-N, or second level of conductor metal lines 323-1, 323-2, . . . , 323-N, are formed above and contacting fourth number of seed layers 321-1, 321-2, . . . , 321-N.

In one embodiment, as shown in FIG. 3, the thin diffusion barrier 315 further covers the second level of copper vias 319-1, 319-2, . . . , 319-N, the second level of copper metal lines 323-1, 323-2, . . . , 323-N, and the third, and fourth number of seed layers, 317-1, 317-2, . . . , 317-N and 321-1, 321-2, . . . , 321-N respectively.

CONCLUSION

Thus, structures and methods have been shown which include a selective electroless copper metallization. The present invention provides for a multilayer copper wiring structure by electroless, selectively deposited copper which will not require chemical mechanical planarization (CMP). Thus, the present invention is streamlined and significantly reduces the amount of deposited conductive material, e.g. copper, which is ultimately discarded according to conventional processes. This also alleviates important environmental concerns regarding the disposition of used materials. Further, by avoiding the need for a CMP process step the usage of consumables such as pads and slurry is conserved.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit, comprising:
   a plurality of semiconductor devices formed in a substrate;
   a first number of locally discontinuous seed layers including a thin film of Palladium (Pd) formed on a number of portions of the at least one of plurality of semiconductor devices;
   the first number of locally discontinuous seed layers having discontinuous island patterns on the at least one of the plurality of semiconductor devices;
   a number of copper vias formed above and contacting the first number of seed layers;
   a second number of seed layers including a thin film of Palladium (Pd) or Copper formed on the number of copper vias; and
   a number of conductor metal lines formed above and contacting the second number of seed layers.

2. The integrated circuit of claim 1, wherein the integrated circuit further includes a thin diffusion barrier covering the number of copper vias, the number of conductor metal lines, and the first and the second number of seed layers.

3. The integrated circuit of claim 2, wherein the thin diffusion barrier has a thickness of less than 8.0 nanometers (nm).

4. The integrated circuit of claim 1, wherein the first number of seed layers have a thickness of less than 15 nanometers (nm).

5. The integrated circuit of claim 1, wherein the first number of seed layers includes a first number of seed layers having a discontinuous island structure.

6. The integrated circuit of claim 1, wherein the number of conductor metal lines includes a number of copper metal lines.

7. An integrated circuit, comprising:
   a substrate including a plurality of transistors;
   a first number of locally discontinuous seed layers including a thin film of Palladium (Pd) having a thickness of less than 15 nanometers (nm), formed on a source and a drain region at least one of the plurality of transistors;
   the first number of locally discontinuous seed layers having discontinuous island patterns on the at least one of the plurality of transistors;
   a number of copper vias formed above and contacting the first number of seed layers;
   a second number of seed layers including a thin film of Palladium (Pd) or Copper formed on the number of copper vias; and
   a number of copper metal lines formed above and contacting the second number of seed layers.

8. The integrated circuit of claim 7, wherein the integrated circuit further includes a thin diffusion barrier, having a thickness of less than 8.0 nanometers (nm), covering the number of copper vias, the number of copper metal lines, and the first and the second number of seed layers.

9. The integrated circuit of claim 8, wherein the thin diffusion barrier includes a graded composition of Tungsten Silicon Nitride (WSixNy), and wherein x varies from 2.0 to 2.5.

10. The integrated circuit of claim 7, wherein the second number of seed layers includes a second number of seed layers having a discontinuous island structure with an island thickness in the range of 3 to 10 nanometers.

11. An integrated circuit, comprising:
    a plurality of semiconductor devices formed in a substrate;
    a first number of seed layers including a thin film of Palladium (Pd) or Copper, having a locally discontinuous island structure which has a thickness in the range of 3 to 10 nanometers, formed on a number of portions of at least one of the plurality of semiconductor devices;
    a number of copper vias formed above and contacting the first number of seed layers;
    the first number of locally discontinuous seed layers having discontinuous island patterns on the at least one of the plurality of semiconductor devices;
    a second number of seed layers including a thin film of Palladium (Pd) or Copper formed on the number of copper vias;
    a number of copper metal lines formed above and contacting the second number of seed layers; and
    a thin diffusion barrier, having a thickness of less than 8.0 nanometers, covering the number of copper vias, the number of copper metal lines, and the first and the second number of seed layers.

12. The integrated circuit of claim 11, wherein the thin diffusion barrier includes a graded composition of Tungsten Silicon Nitride (WSixNy), and wherein x varies from 2.0 to 2.5.

13. The integrated circuit of claim 11, wherein the second number of seed layers includes a second number of seed layers having a discontinuous island structure with an island thickness in the range of 3 to 10 nanometers.

14. The integrated circuit of claim 11, wherein the thin diffusion barrier has a thickness in the range of 2.0 to 6.0 nanometers.

15. A multilayer copper wiring structure, comprising:
    a plurality of semiconductor devices; formed in a substrate;
    a first number of locally discontinuous seed layers including a thin film of Palladium (Pd) formed on a number of portions of at least one of the plurality of semiconductor devices;
    the first number of locally discontinuous seed layers having discontinuous island patterns on the at least one of the plurality of semiconductor devices;

a first level of copper vias formed above and contacting the first number of seed layers;

a second number of seed layers including a thin film of Palladium (Pd) or Copper formed on the first level of copper vias;

a first level of copper metal lines formed above and contacting the second number of seed layers;

a third number of seed layers including a thin film of Palladium (Pd) or Copper formed on the first level of copper metal lines;

a second level of copper vias formed above and contacting the third number of seed layers;

a fourth number of seed layers including a thin film of Palladium (Pd) or Copper formed on the second level of copper vias; and a second level of copper metal lines formed above and contacting the fourth number of seed layers.

16. The multilayer copper wiring structure of claim 15, wherein the structure further includes a thin diffusion barrier, having a thickness of less than 8.0 nanometers (nm), covering the first and the second level of copper vias, the first and the second level of copper metal lines, and the first, second, third, and fourth number of seed layers.

17. The multilayer copper wiring structure of claim 15, wherein the thin diffusion barrier includes a graded composition of Tungsten Silicon Nitride (WSixNy), and wherein x varies from 2.0 to 2.5.

18. The multilayer copper wiring structure of claim 15, wherein the first, second, third, and fourth number of seed layers include a discontinuous island structure with an island thickness in the range of 3 to 10 nanometers.

19. A multilayer copper wiring structure, comprising:
a substrate including a plurality of transistors;
a first number of locally discontinuous seed layers including a thin film of Palladium (Pd) or Copper, having a thickness of less than 15 nanometers (nm), formed on a source and a drain region of at least one of the plurality of transistors;

the first number of locally discontinuous seed layers having discontinuous island patterns on the at least one of the plurality of transistors;

a first level of copper vias formed above and contacting the first number of seed layers;

a second number of seed layers including a thin film of Palladium (Pd) or Copper, having a thickness of less than 15 nanometers (nm), formed on the first level of copper vias;

a first level of copper metal lines formed above and contacting the second number of seed layers;

a third number of seed layers including a thin film of Palladium (Pd) or Copper, having a thickness of less than 15 nanometers (nm), formed on the first level of copper metal lines;

a second level of copper vias formed above and contacting the third number of seed layers;

a fourth number of seed layers including a thin film of Palladium (Pd) or Copper, having a thickness of less than 15 nanometers (nm), formed on the second level of copper vias;

a second level of copper metal lines formed above and contacting the fourth number of seed layers; and a thin diffusion barrier, having a thickness of less than 8.0 nanometers, covering the first and the second level of copper vias, the first and the second level of copper metal lines, and the first, second, third, and fourth number of seed layers.

20. The multilayer copper wiring structure of claim 19, wherein the thin diffusion barrier includes a graded composition of Tungsten Silicon Nitride (WSixNy), and wherein x varies from 2.0 to 2.5.

21. The multilayer copper wiring structure of claim 19, wherein the first, second, third, and fourth number of seed layers include a discontinuous island structure with an island thickness in the range of 3 to 10 nanometers.

22. The multilayer copper wiring structure of claim 19, wherein the thin diffusion barrier has a thickness in the range of 2.0 to 6.0 nanometers.

23. An integrated circuit, comprising:
a semiconductor substrate having a top surface including a plurality of transistors, and a patterned insulator layer having a predetermined vertical thickness overlaying the at least one transistor having openings to access selected portions of the at least one transistor;

a first seed material forming a locally discontinuous layer covering the patterned insulator layer and discontinuously covering the selected portions of the at least one of the plurality of transistors;

the first number of locally discontinuous seed layers having discontinuous island patterns on the at least one of the plurality of transistors;

a first level of conductive material covering a selected portion of the first seed layer including at least a portion of the first level of conductive material filling the openings in the patterned insulator layer, the first level of conductive material extending to about the predetermined vertical thickness of the patterned insulator layer;

a second seed material forming a discontinuous layer covering at least a top surface of the first level of conductive material;

a second level of conductive material covering at least a portion of the top surface of the first level of conductive material, and not contacting any portion of the patterned insulator layer;

a third seed material forming a discontinuous layer covering at least a portion of a top surface of the second level of conductive material;

a third level of conductive material covering at least a portion of the top surface of the second level of conductive material, and not contacting any portion of the patterned insulator layer or the first conductive layer;

a fourth seed material forming a discontinuous layer covering at least a top surface of the third level of conductive material; and a fourth level of conductive material covering at least a portion of the top surface of the third level of conductive material, and not contacting any portion of the patterned insulator layer, the first conductive layer, or the second conductive layer.

24. The integrated circuit of claim 23 further comprising the first seed layer having an average thickness in the range of 3 to 10 nanometers.

25. The integrated circuit of claim 23 further comprising the first level of conductive material includes a diffusion barrier having a thickness of less than 8 nanometers.

26. The integrated circuit of claim 25 further comprising the diffusion barrier includes a graded composition of Tungsten Silicon Nitride (WSixNy).

27. The integrated circuit of claim 26 further comprising the value of x varies from 2.0 to 2.5.

28. The integrated circuit of claim 23 further comprising the second level of conductive material includes a diffusion barrier having a thickness of less than 8 nanometers.

29. The integrated circuit of claim 23 further comprising the first level of conductive material forms at least one substantially vertical pillar extending in a vertical direction above the level of the patterned insulator layer.

30. The integrated circuit of claim 23 further comprising the second level of conductive material forms horizontal air bridges between selected ones of the at least one substantially vertical pillars formed of the first conductive material.

31. The integrated circuit of claim 23 further comprising the third level of conductive material forms at least one substantially vertical pillar extending in a vertical direction above the level of the patterned insulator layer and above the level of the second level of conductive material.

32. The integrated circuit of claim 31 further comprising the fourth level of conductive material forms horizontal air bridges between selected ones of the at least one substantially vertical pillars formed of the third conductive material.

33. The integrated circuit of claim 23 further comprising the third level of conductive material includes a diffusion barrier having a thickness of less than 8 nanometers.

34. The integrated circuit of claim 23 further comprising the fourth level of conductive material includes a diffusion barrier having a thickness of less than 8 nanometers.

* * * * *

UNITED STATES PATENT AND TRADEMARK OFFICE
CERTIFICATE OF CORRECTION

PATENT NO. : 7,262,505 B2  Page 1 of 1
APPLICATION NO. : 10/929251
DATED : August 28, 2007
INVENTOR(S) : Ahn et al.

It is certified that error appears in the above-identified patent and that said Letters Patent is hereby corrected as shown below:

On The Title Page, Item (56) under "Other Publications", line 2, delete "Films", VLSI" and insert -- Films", VLSI --, therefor.

In column 13, line 33 (Approx.), in Claim 1, after "portions of" delete "the".

In column 13, line 33 (Approx.), in Claim 1, after "at least one of" insert -- the --.

In column 13, line 67, in Claim 7, after "a drain region" insert -- of --.

In column 14, line 59, in Claim 15, delete "devices;" and insert -- devices --, therefor.

In column 16, line 21, in Claim 23, after "selected portions of" delete "the".

Signed and Sealed this

Thirteenth Day of November, 2007

JON W. DUDAS
*Director of the United States Patent and Trademark Office*